United States Patent [19]
Noble

[11] Patent Number: 5,892,707
[45] Date of Patent: Apr. 6, 1999

[54] MEMORY ARRAY HAVING A DIGIT LINE BURIED IN AN ISOLATION REGION AND METHOD FOR FORMING SAME

[75] Inventor: Wendell Noble, Milton, Vt.

[73] Assignee: Micron Technology, Inc., Boise, Id.

[21] Appl. No.: 845,609

[22] Filed: Apr. 25, 1997

[51] Int. Cl.$^6$ .................................................. G11C 11/24
[52] U.S. Cl. ...................... 365/149; 365/182; 257/905
[58] Field of Search .................... 365/149, 182; 257/301, 306, 303, 905; 438/262

[56] References Cited

U.S. PATENT DOCUMENTS

| | | | |
|---|---|---|---|
| 4,604,162 | 8/1986 | Sobczak | 156/657 |
| 4,649,625 | 3/1987 | Lu | 257/301 |
| 5,198,995 | 3/1993 | Dennard et al. | 365/149 |
| 5,214,603 | 5/1993 | Dhong et al. | 365/207 |
| 5,391,911 | 2/1995 | Beyer et al. | 257/522 |
| 5,497,017 | 3/1996 | Gonzales | 257/306 |
| 5,539,229 | 7/1996 | Noble, Jr. et al. | 257/301 |
| 5,617,351 | 4/1997 | Bertin et al. | 365/149 X |

FOREIGN PATENT DOCUMENTS 0 720 221 A1   7/1996   European Pat. Off. .

OTHER PUBLICATIONS

Kuge, Shigehiro et al., "*SOI–DRAM Circuit Technologies for Low Power High Speed Multigiga Scale Memories,*" IEEE Journal of Solid–State Circuits, vol. 31, No. 4, Apr. 1996, pp. 586–591.

Suma, Katsuhiro et al., "*An SOI–DRAM with Wide Operating Voltage Range by CMOS/SIMOX Technology,*" IEEE Journal of Solid State Circuits, vol. 29, No. 11, Nov. 1994, pp. 1323–1329.

Kohyama et al., "Buried Bit–Line Cell for G–4MB DRAMs," in IEEE, 1990 Symposium on VLSI Technology, pp. 2/3–3/3.

Davari et al., "A variable–Size Shallow Trench Isolation (STI) Technology With Diffused Sidewall Doping For Submicron CMOS," in *iedm Technical Digest*, International Electron Devices Meeting, San Francisco, California, Dec. 11–14, 1988, pp. 92–95.

Bakeman et al., "A high performance 16–Mb Dram Technology," in *1990 Symposium on VLSI Technology Digest of Technical Papers*, 1990 VLSI Technology Symposium, Honolulu, Hawaii, Jun. 4–7, 1990, pp. 11–12.

*Primary Examiner*—Huan Hoang
*Attorney, Agent, or Firm*—Seed and Berry LLP

[57] ABSTRACT

A memory array includes a semiconductor substrate, an isolation trench disposed in the substrate, and a conductor that is disposed in the trench. The array also includes a memory cell that is coupled to the conductor in the trench. The conductor may be a digit line that is coupled to a source/drain region of the memory cell or to a shared source/drain region of a pair of adjacent memory cells.

39 Claims, 24 Drawing Sheets

Fig. 25

MEMORY ARRAY HAVING A DIGIT LINE BURIED IN AN ISOLATION REGION AND METHOD FOR FORMING SAME

TECHNICAL FIELD

The invention relates generally to memory arrays, and more particularly to a memory array having one or more bit, i.e., digit, lines buried in the isolation regions such as silicon-trench-isolation (STI) regions.

BACKGROUND OF THE INVENTION

To accommodate continuing consumer demand for integrated circuits that perform the same or additional functions and yet have a reduced size as compared with available circuits, circuit designers continually search for ways to reduce the size of the memory arrays within these circuits without sacrificing array performance. For example, one known technique for reducing the layout area of a Dynamic Random Access Memory (DRAM) array is to stack storage capacitors above memory cells. Typically, the memory cells are formed in adjacent pairs, where each pair shares a common source/drain region that is connected to a respective digit line. Because the digit lines are disposed above the stack capacitors, and thus above the common source/drain regions, conductive vias are needed to connect the digit lines to the respective common source/drain regions. Therefore, these vias must extend through or adjacent to the plates of the stacked storage capacitors.

A problem with such a stacked-capacitor memory array is that the area of each memory cell, and thus the area of the memory array itself, often cannot be reduced without reducing the capacitances of the stacked capacitors beyond acceptable limits. Because capacitance is proportional to the overlap area of the capacitor plates, the plates of the stacked capacitors must have an overlap area that is large enough to give these capacitors the desired storage capabilities. But the vias that connect the common source/drain regions to the digit lines also have minimum dimensions that are proportional to the minimum feature size of the utilized semiconductor process. Therefore, because a via extends through a hole in a respective pair of stacked-capacitor plates, the minimum total area of a plate is the sum of the minimum required overlap area and the minimum required cross-section area of the intersecting via.

To solve this problem, the article "Buried Bit-Line Cell for 64 MB DRAMS," proposes burying the bit-lines in the substrate. But, because these bit-lines are formed after the field oxide regions and because the contacts between the bit-lines and the respective memory cells are also buried in the substrate, the resulting reduction in memory-cell area falls short of the maximum obtainable reduction for a given minimum feature size.

Another problem is that, even if it were possible to reduce the area of such a memory array by the maximum obtainable reduction, it would be difficult, if not impossible, to implement a folded-digit-line architecture in such a reduced-area array. In such an architecture, there are typically four word lines that extend over a memory cell pair, as compared with two word lines in a shared-digit-line architecture. Like the vias, the word lines have minimum dimensions that are dictated by the minimum feature size. Therefore, if the area of a memory cell is reduced too much, adjacent word lines may become short-circuited to each other, thus rendering the memory array defective.

SUMMARY OF THE INVENTION

In accordance with one aspect of the invention, a memory array includes a semiconductor substrate, an isolation trench located in the substrate, and a conductor that is located in the trench. The array also includes a memory cell that is coupled to the conductor in the trench. In another embodiment of the invention, the conductor is a digit line that is coupled to a source/drain region of the memory cell.

Thus, where the conductor in the isolation trench is a digit line, no digit-line vias are required. The freed-up space can be used to increase the size, and thus the capacitances, of the stacked capacitors. Or, it can be used to reduce the size of the memory cells without reducing these capacitances.

BRIEF DESCRIPTION OF THE DRAWINGS

FIGS. 1–9 show a first embodiment of a method for forming a memory array according to the invention. FIGS. 1, 2B, 3, and 4B are cross-sectional views, FIGS. 2A, 4A, 7, and 8 are top plan views, and FIGS. 5, 6 and 9 are isometric views.

FIGS. 10–17 show a second embodiment of a method for forming a memory array according to the invention. FIGS. 10 and 11B are cross-sectional views, FIGS. 12–17 are isometric views.

FIGS. 20–31 show an embodiment of a method for forming stacked capacitors in a memory array according to the invention. FIGS. 20, 22, 23A, and 24A–31 are cross-sectional views

DETAILED DESCRIPTION OF THE INVENTION

Figure 1:
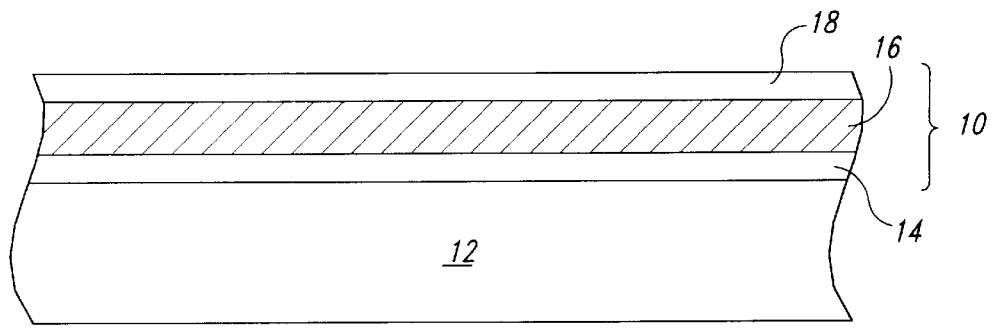

FIGS. 1–9 show a first embodiment of a method for forming a memory array having buried digit lines. Referring to FIG. 1, a pad structure 10 is conventionally formed on a semiconductor substrate 12, which is formed from a material such as silicon. The pad structure 10 includes a gate insulator 14 that is disposed on the substrate 12, a gate conductor 16 that is disposed on the insulator 14, and a protective pad 18 that is disposed on the gate conductor 16. In one embodiment, the gate insulator 14 is silicon dioxide, the gate conductor 16 is polysilicon, and the protective pad 18 is silicon nitride.

Figure 2A:
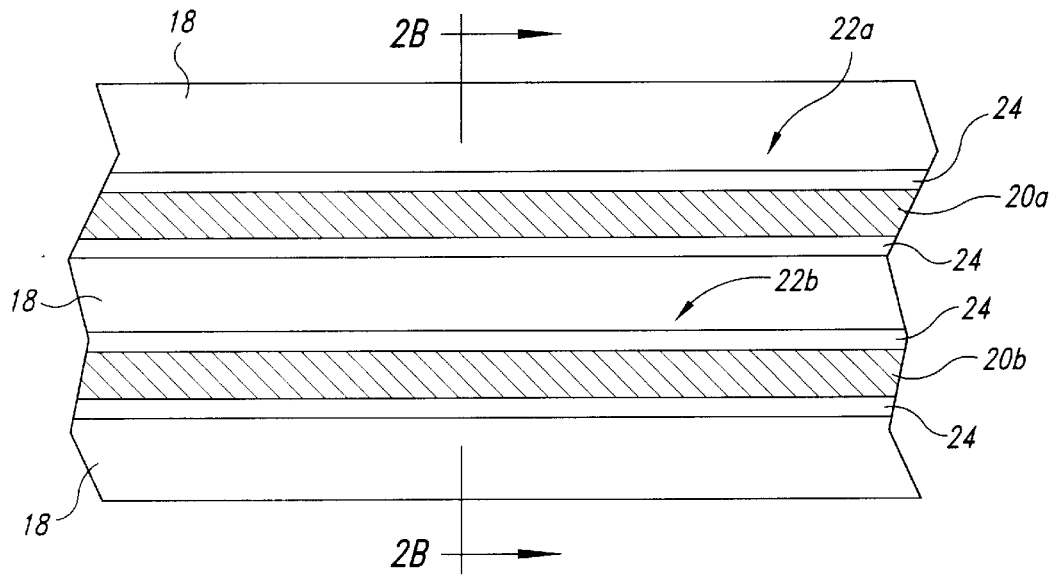
Figure 2B:
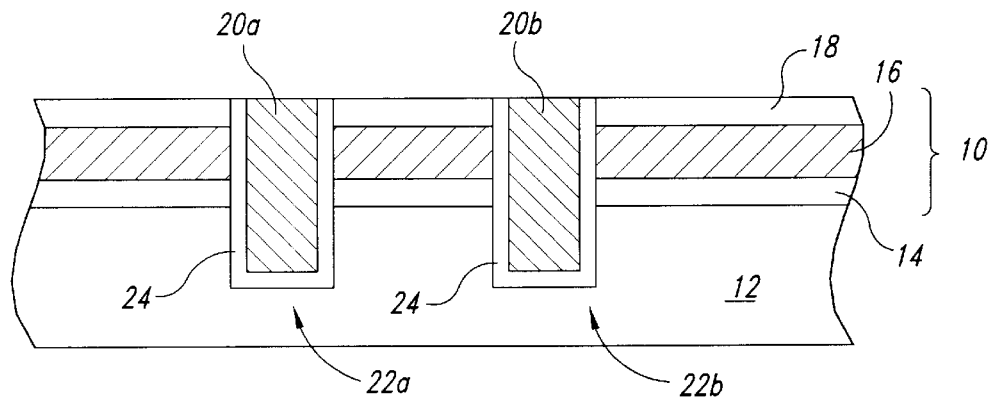

Referring to FIG. 2A, which is a top plan view, and FIG. 2B, which is a cross section taken along lines 2B of FIG. 2A, a plurality of buried digit lines 20 are formed in the substrate 12. For clarity, only the digit lines 20a and 20b are shown. First, a photoresist mask (not shown) that exposes the patterns for a pair of isolation trenches 22a and 22b is conventionally formed on the pad 18. Next, the exposed regions of the pad 18 are conventionally etched, and then the mask is conventionally stripped. The remaining regions of the pad 18 mask the unexposed regions of the layers 14 and 16 and the substrate 12 while the exposed regions are conventionally etched to form the trenches 22a and 22b. In one embodiment, the trenches 22a and 22b extend approximately 0.3 microns ($\mu$m) into the substrate 12.

Next, a sacrificial oxide layer (not shown) is conventionally grown in the trenches 22a and 22b and then conventionally stripped to smoothen the trench walls. A thin passivation oxide (not shown) is then conventionally grown in the trenches 22a and 22b.

An oxide layer 24 is then conventionally formed in the trenches 22a and 22b. The layer 24 may be deposited using chemical vapor deposition (CVD) such as in the well-known TEOS process, or may be thermally grown. Because the alignment tolerance is approximately ⅓ the minimum line width allowed by the process, in one embodiment, the maximum thickness of the layer 24 is ⅓ of the trench width. This ensures proper alignment between the buried digit lines 20a and 20b and the respective source/drain contact straps (not shown in FIGS. 2A and 2B) as discussed below. Thus, in an embodiment where the trench width (before the formation of the layer 24) is approximately 40 nanometers (nm), the thickness of the layer 24 is approximately 10–15 nm, leaving trench openings that are approximately 10–20 nm wide.

Next, the trenches 22a and 22b are conventionally filled with a conductive material to form the digit lines 20a and 20b. In one embodiment, heavily doped polysilicon, tungsten, or another suitable material is CVD deposited in the trenches 22a and 22b and on the pad 18. Using conventional chemical-mechanical polishing (CMP) techniques, the structure is then polished so that the surfaces of the digit lines 20a and 20b are substantially even with the surface of the pad 18, which is used as a polish stop.

Figure 3:
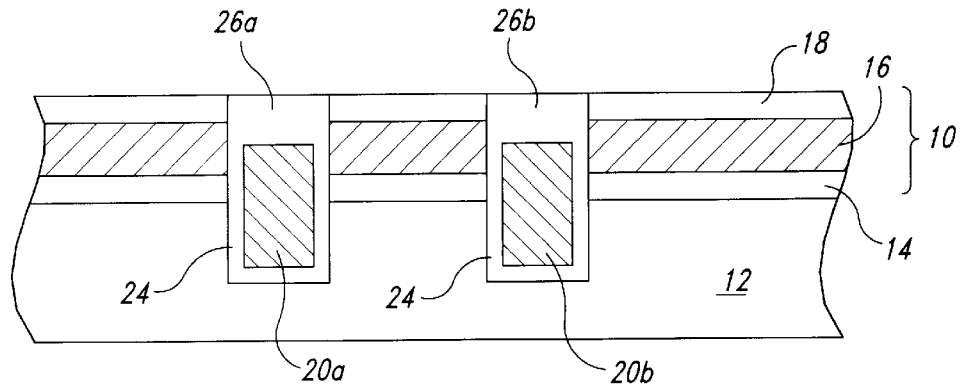

Referring to FIG. 3, which is a side view, the digit lines 20a and 20b are then conventionally recessed below the surface of the pad 18 and conventionally capped with an insulator. In one embodiment, the digit lines 20a and 20b are etched to approximately 70 nm below the surface. Next, silicon dioxide is CVD deposited and then polished back to the surface of the pad 18 to form the oxide caps 26a and 26b. Thus, the caps 26a and 26b, together with the layer 24, encapsulate the lines 20a and 20b, respectively.

Figure 4A:
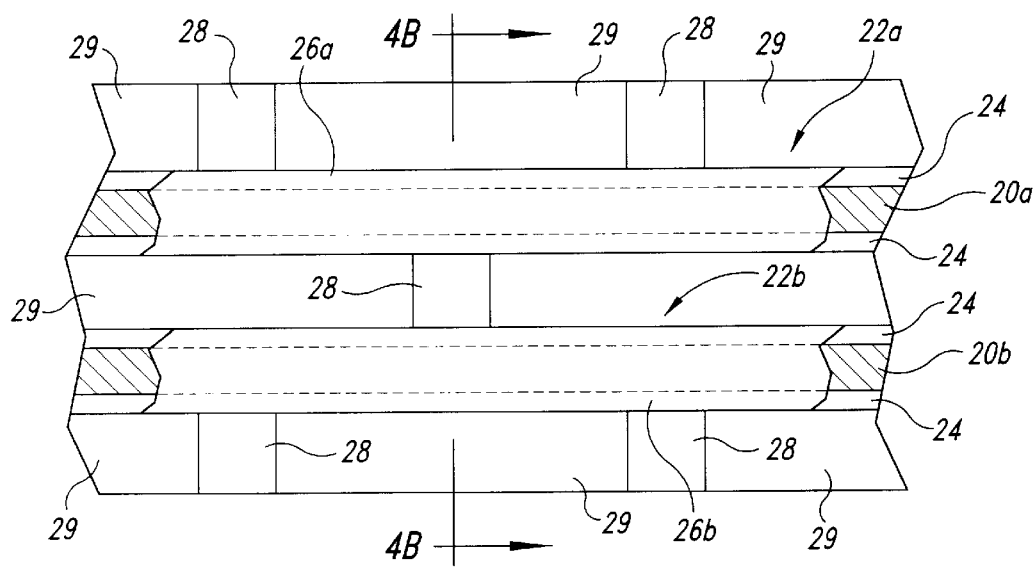
Figure 4B:
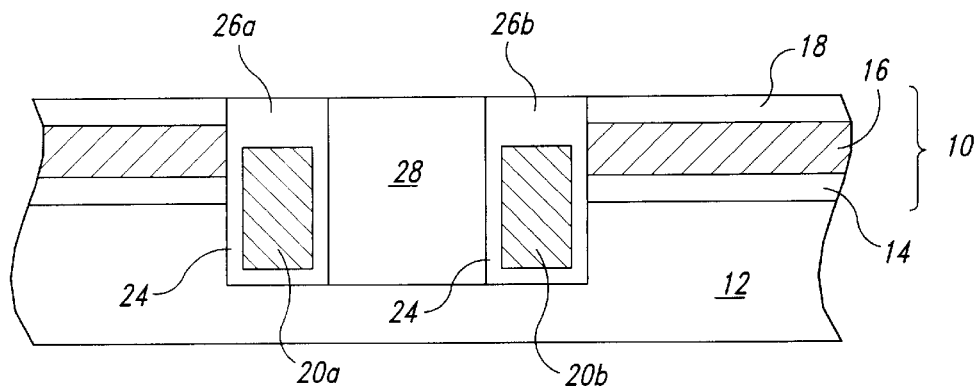

Referring to FIG. 4A, which is a top plan view, and FIG. 4B, which is a cross section of FIG. 4A taken along lines 4B, a plurality of isolation segments 28 are conventionally formed to define active areas 29 of the substrate 12. In one embodiment, a mask (not shown) is formed to expose the regions of the pad 18 where the segments 28 are to be formed. The pad 18 is then etched and the mask is removed. Next, with the remaining regions of the pad 18 acting as a mask, the exposed portions of the conductor 16 and the insulator 14 are etched to expose respective portions of the substrate 12. Because the insulator 14 is significantly thinner than the caps 26a and 26b, the etching of the insulator 14 has a minimal effect on the thickness of the caps 26a and 26b. Then, the exposed regions of the substrate 12 are etched to the desired depth, which is approximately 3 μm in one embodiment. Next, a sacrificial oxide (not shown) is grown in the etched regions of the substrate 12. The sacrificial oxide is stripped, and then a thin passivation oxide (not shown) is grown in the etched regions of the substrate 12. An oxide such as TEOS is CVD deposited to fill the recesses in the substrate 12, layers 14 and 16, and pad 18. The oxide is then polished back to the surface of the pad 18 to form the isolation segments 28.

Figure 5:
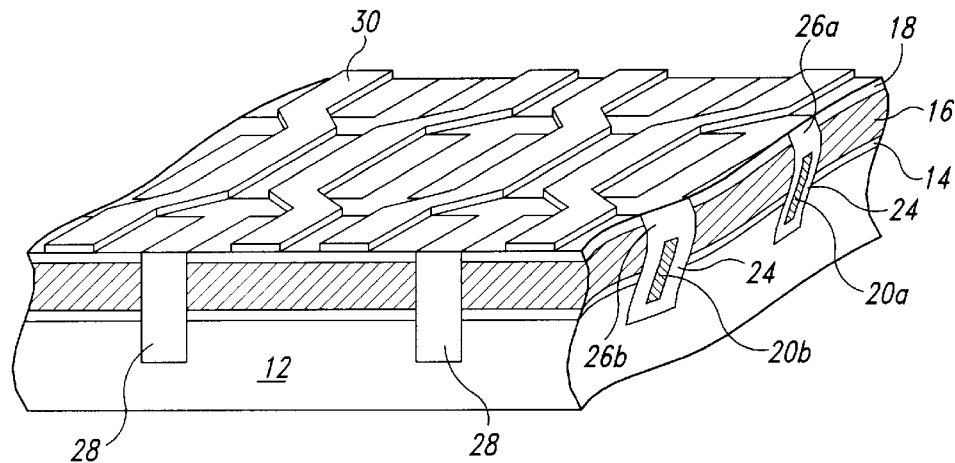

Referring to FIG. 5, which is an isometric view, a mask 30 is conventionally formed to provide a pattern for etching the gates of the transistors in the memory cells.

Figure 6:
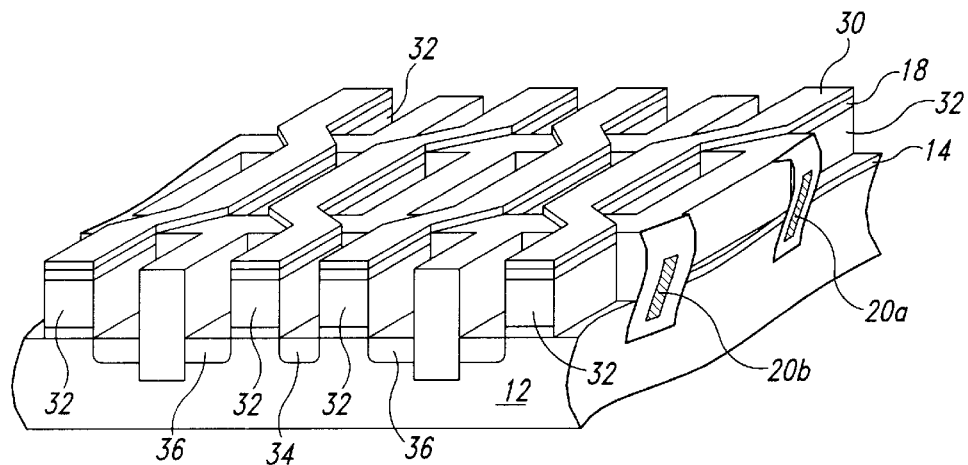

Referring to FIG. 6, which is an isometric view, the exposed regions of the pad 18 and the conductor 16 are conventionally etched to form the transistor gates 32. Using the insulator 14 as a screening layer, the exposed regions of the substrate 12 are then conventionally implanted with a dopant to form the common and uncommon source/drain regions 34 and 36, respectively. After the implant, the regions of the insulator 14 that are on the source/drain regions 34 and 36 are conventionally removed.

Figure 7:
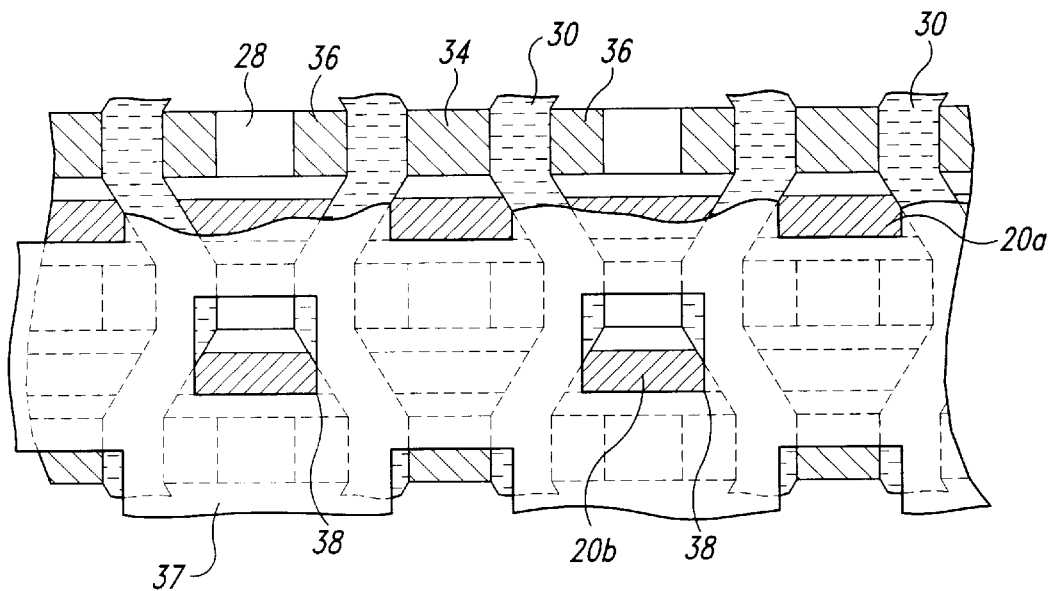

Referring to FIG. 7, which is a top plan view, a mask 37 is conventionally formed, and openings 38 are conventionally formed therein. The openings 38 expose the common source/drain regions 34 and the respective regions of the isolation trenches 22a and 22b that are adjacent to the common regions 34. The exposed regions of the insulator caps 26a and 26b are then etched to expose the respective underlying regions of the digit lines 20a and 20b.

Figure 9:
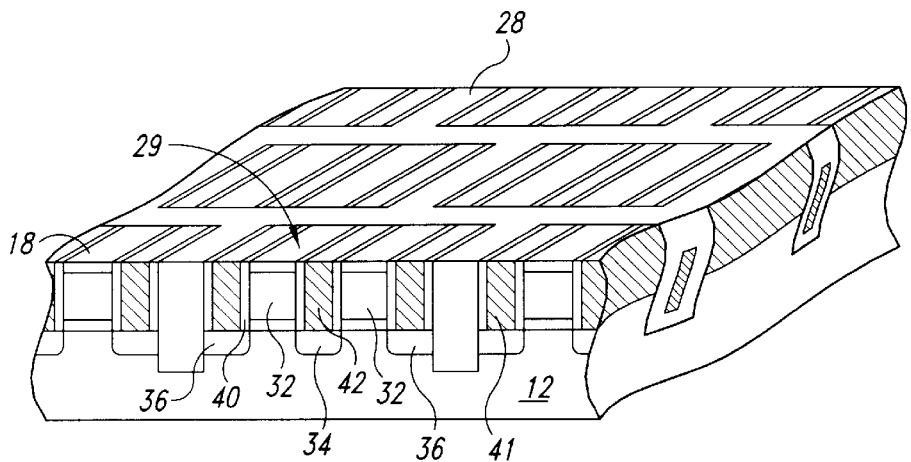
Figure 8:
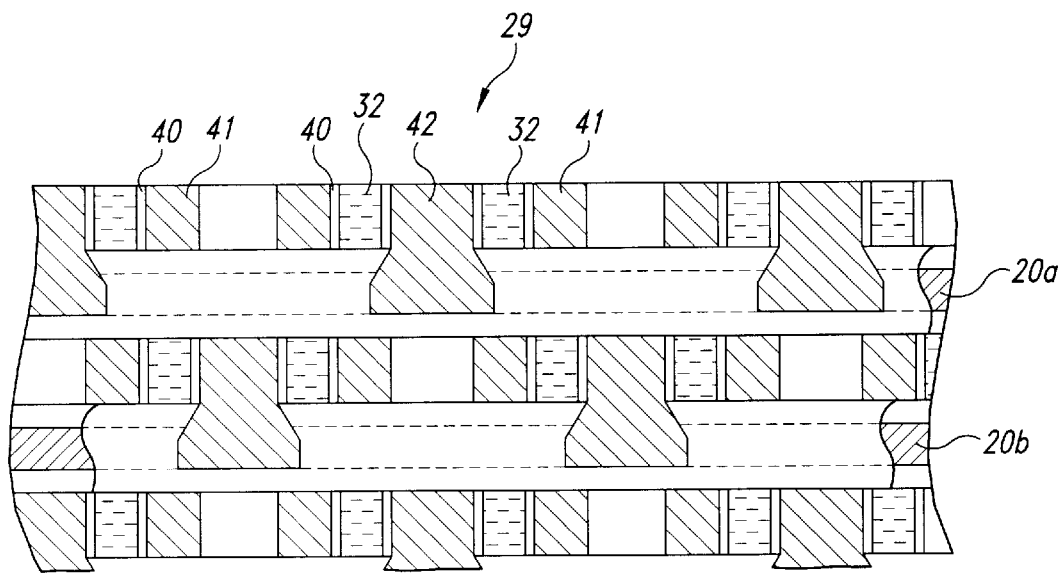

Referring to FIG. 8, which is a top plan view, and FIG. 9, which is an isometric view, the masks 30 and 37 are conventionally removed, and an insulator layer is conventionally formed on all of the exposed surfaces. In one embodiment, a layer of silicon dioxide is CVD deposited on all of the exposed, surfaces, and the thickness of this layer is approximately 20–50 nm. The layer is then anisotropically etched, using a conventional technique such as reactive ion etching (RIE), to form insulative sidewalls 40 on the exposed vertical sidewalls of the gates 32. A conductive material 41 is then conventionally deposited to fill in the spaces above the exposed regions of the digit lines 20a and 20b and the regions 34 and 36. The conductor 41 is then conventionally polished back to the surface of the pad 18.

Thus, respective regions of the conductor 41 form straps 42, which electrically couple the common source/drain regions 34 to the respective adjacent digit lines 20a and 20b. Because the digit lines 20a and 20b are buried in the isolation trenches 22a and 22b, no digit lines need be formed above the memory cells, and thus no digit-line vias need be formed. The absence of these vias allows more space for the plates of the stacked capacitors (not shown in FIGS. 8 and 9), and thus allows one to either increase the capacitance of the capacitors, or to reduce the dimensions of the memory cells and thus the overall size of the memory array.

Furthermore, within each active area 29 is formed a pair of memory cells that each include a respective one of the regions 36 and that share the common source/drain region 34 with the other cell. In one embodiment, the substrate 12 is doped with a P-type dopant such as Boron, and the regions 34 and 36 are doped with an N-type dopant such as phosphorous or arsenic.

Still referring to FIG. 9, in the illustrated embodiment, the isolation segments 28 are staggered such that the segments on one side of a trench 22 are approximately halfway between the respective adjacent segments 28 on the other side of the same trench. This allows the gates 32 to also be staggered, and the word lines (not shown in FIG. 9) to be laid out in a folded-digit-line architecture as discussed below.

FIGS. 10–17 show a second embodiment for forming a memory array according to the invention. In these Figures, like numbers refer to like structures in FIGS. 1–9.

Figure 10:
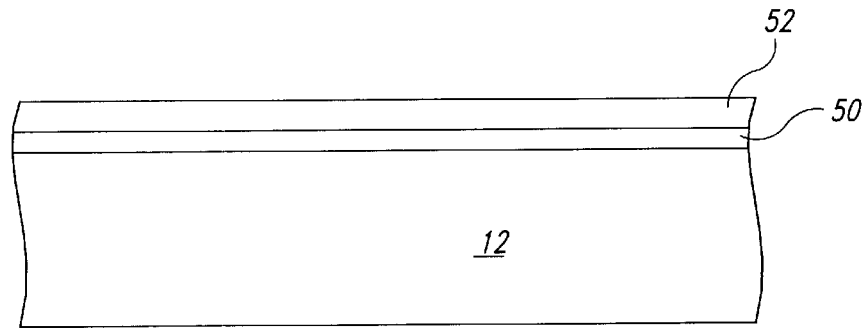

Referring to FIG. 10, which is a cross-sectional view, one main difference between this embodiment and that described with reference to FIGS. 1–9 is that the gate conductor and the gate oxide are not formed on the substrate 12 at the beginning of the process. Instead, a thin thermal oxide layer 50 is conventionally formed on the silicon substrate 12, and a pad nitride 52 is conventionally formed on the oxide 50.

Figure 11A:
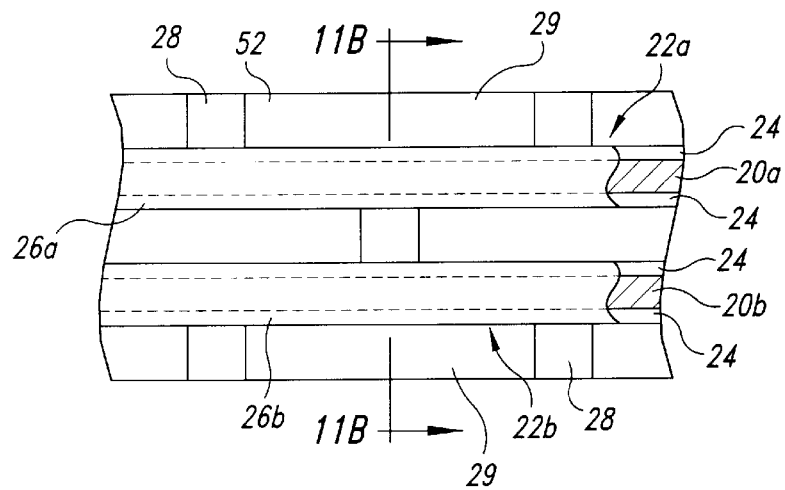
FIG. 11A is a top plan view.
Figure 11B:
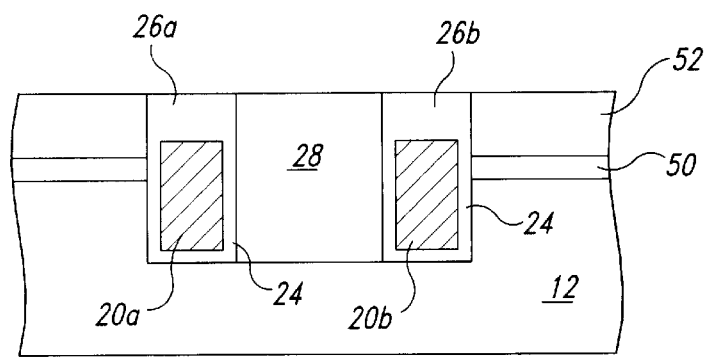
Figure 12:
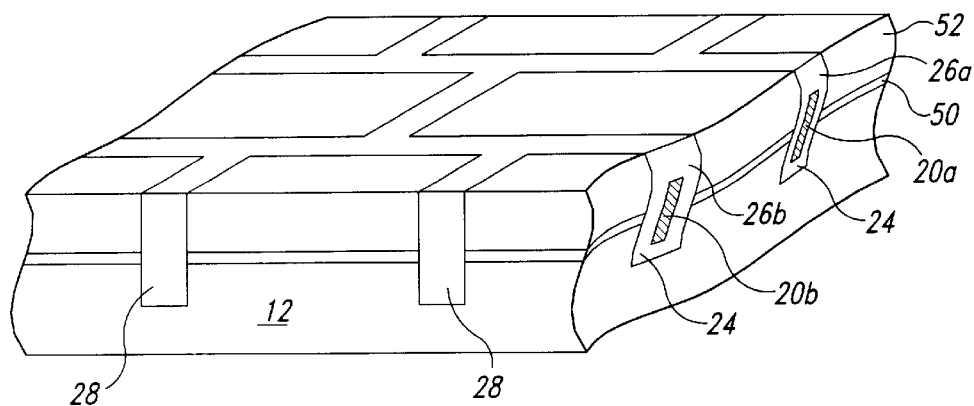

Referring to FIG. 11A, which is a top plan view, FIG. 11B, which is a cross section of FIG. 11A taken along lines 11B, and FIG. 12, which is an isometric view, the digit lines 20a and 20b, trenches 22a and 22b, insulator layer 24, insulator caps 26a and 26b, and isolation segments 28 are formed in a manner that is similar to that described above in conjunction with FIGS. 1–4B.

Figure 13:
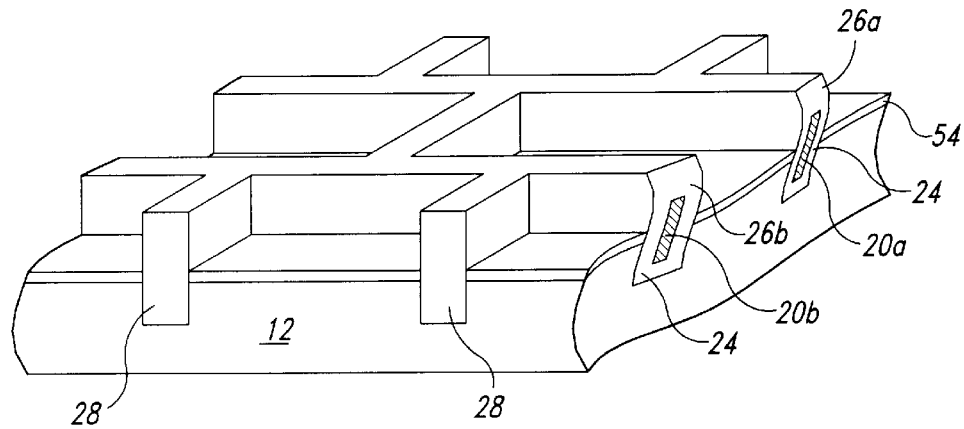

Referring to FIG. 13, which is an isometric view, the pad nitride 52 and the layer 50 are conventionally removed, and a gate insulator 54 is conventionally formed on the exposed areas of the substrate 12. In one embodiment, the insulator 54 is silicon dioxide and is either grown or CVD deposited.

Figure 14:
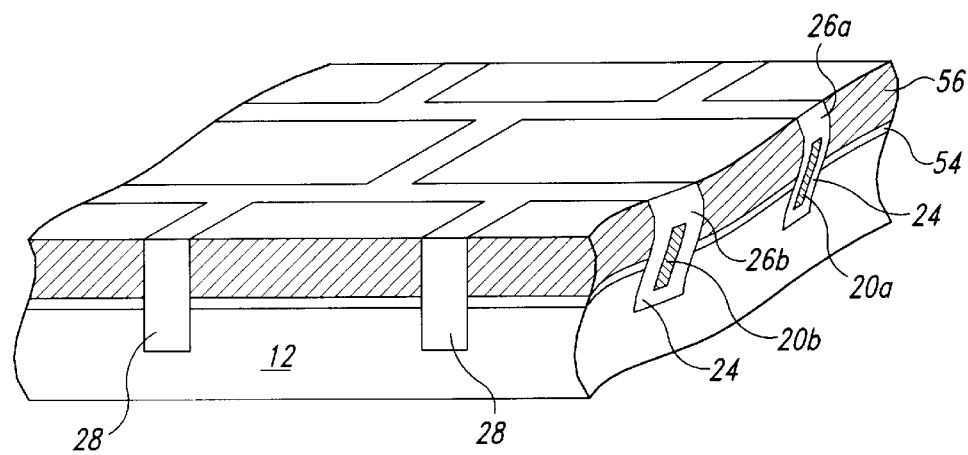

Referring to FIG. 14, which is an isometric view, a gate conductor 56 is conventionally formed on the insulator 54. In one embodiment, the conductor 56 is polysilicon that is CVD deposited. The conductor 56 is then polished back so that it is substantially even with the surfaces of the trenches 22a and 22b and the isolation segments 28.

Figure 15:
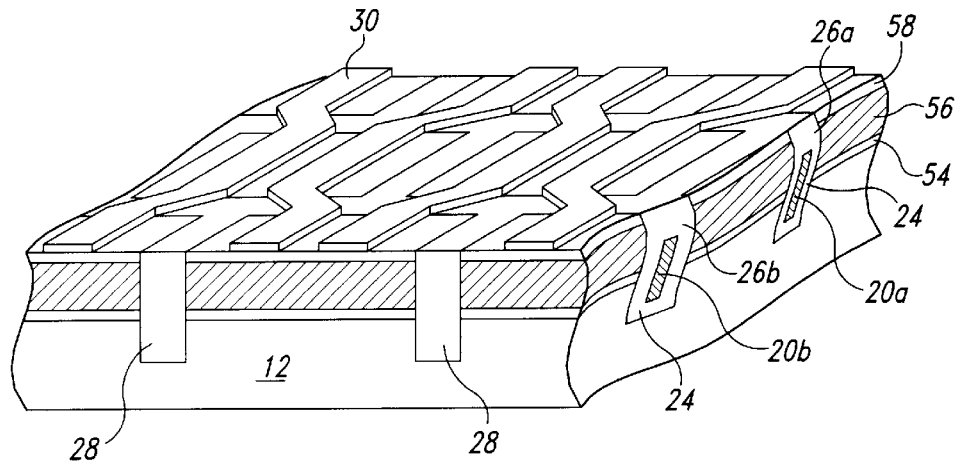

Referring to FIG. 15, which is an isometric view, the conductor 56 is then conventionally etched such that it becomes recessed with respect to the surfaces of the isolation trenches 22a and 22b and the isolation segments 28. In one embodiment, the conductor 56 is recessed approximately 100 nm. Next, a nitride layer 58 is conventionally formed on the conductor 56 and then polished back to be substantially even with the surfaces of the trenches 22 and the segments 28. The mask 30 is then conventionally formed as discussed above in conjunction with FIG. 5.

Figure 16:
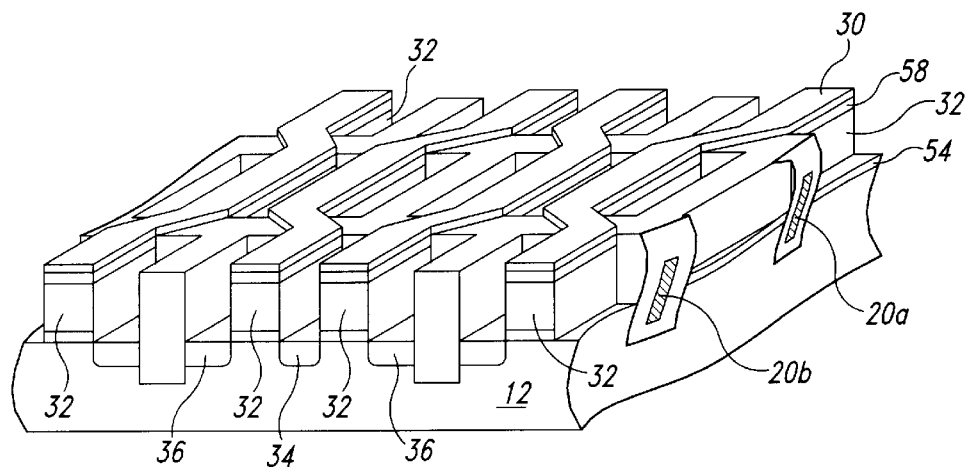

Referring to FIG. 16, which is an isometric view, the gate segments 32, the common source/drain regions 34, and the uncommon source/drain regions 36 are formed in a manner similar to that described above in conjunction with FIG. 6.

Figure 17:
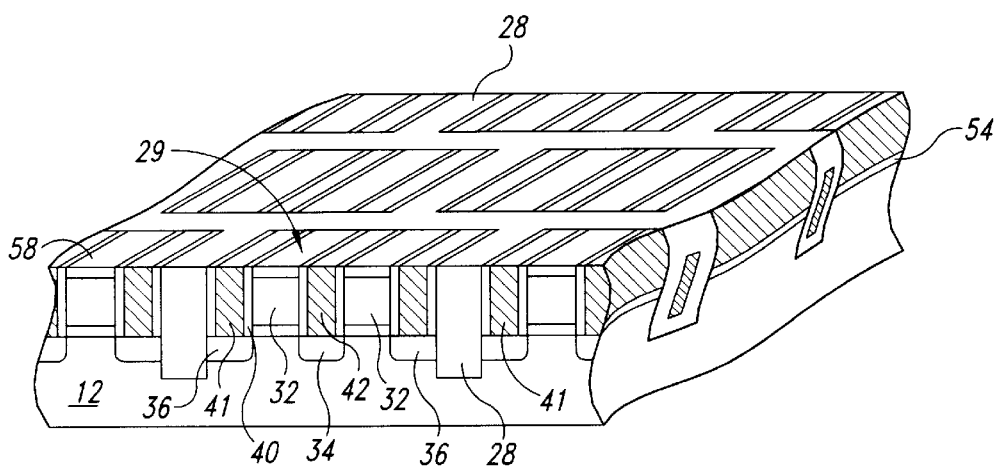

Referring to FIG. 17, which is an isometric view, the sidewalls 40, conductive material 41, and straps 42 are formed in a manner similar to that described above in conjunction with FIGS. 7–9.

Figure 31:
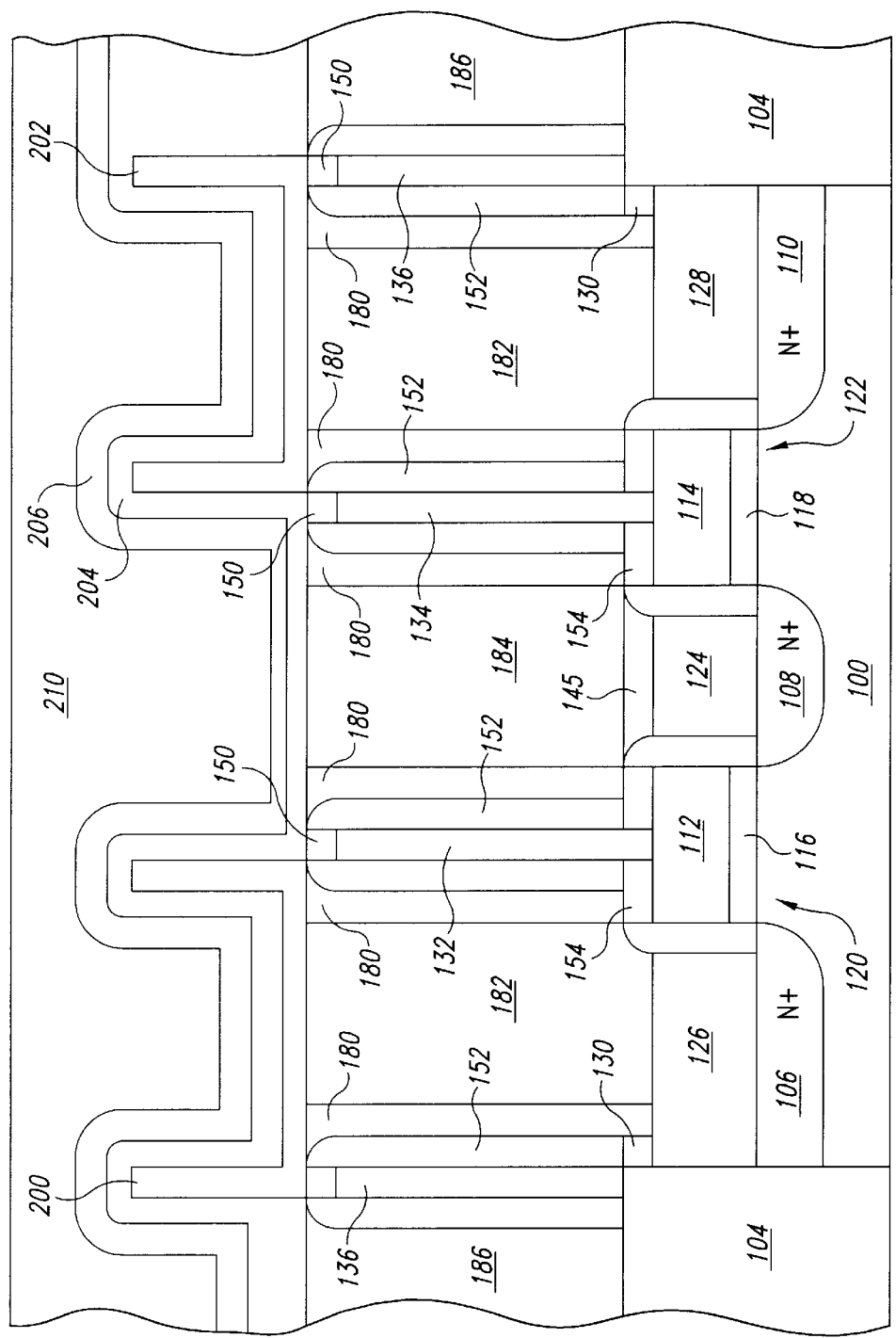
Figure 32:
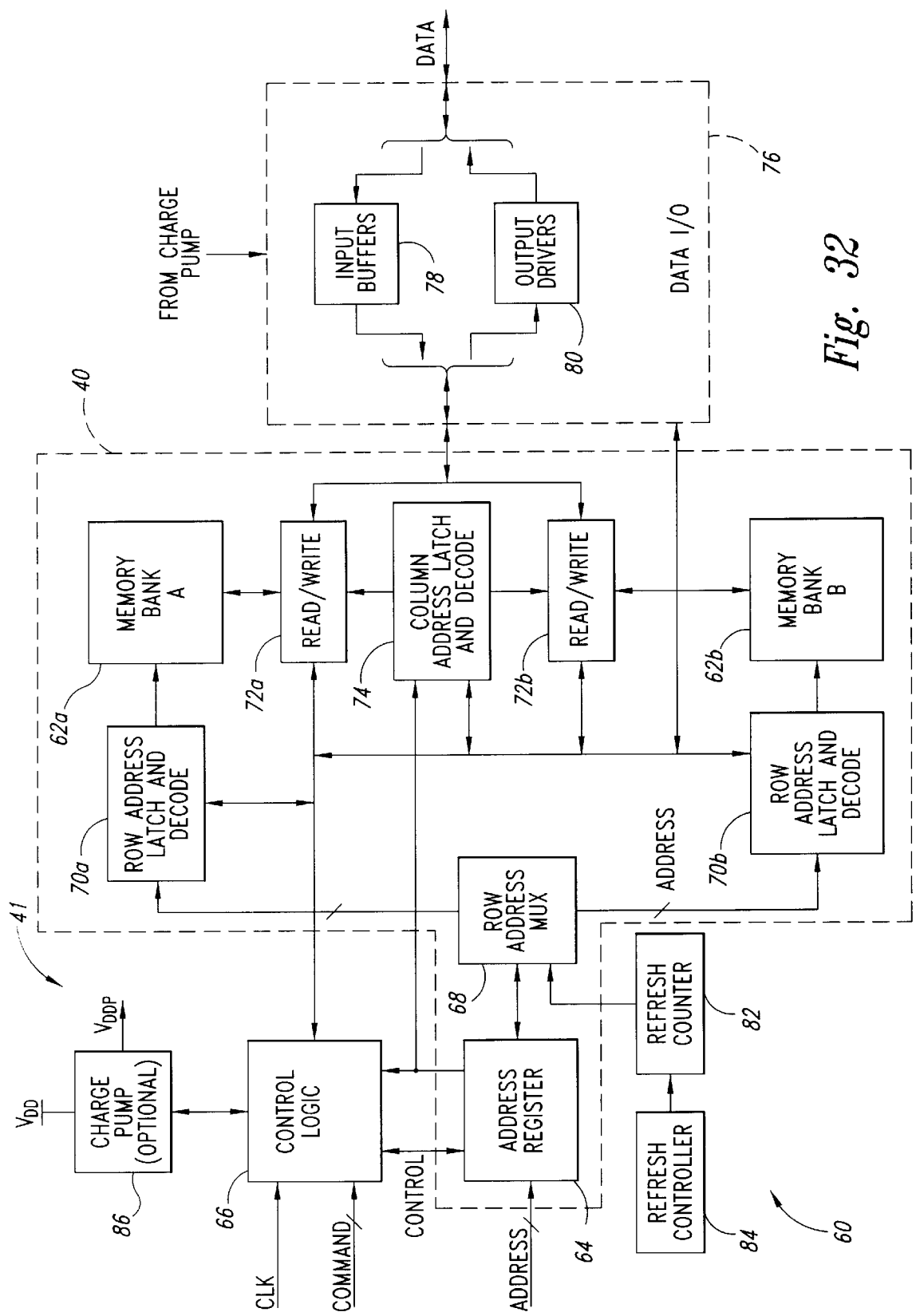
FIG. 32 is a schematic diagram of a memory circuit that includes an embodiment of a memory array according to the present invention.

FIG. 32 is a block diagram of one embodiment of a memory circuit 60, which includes memory banks 62a and 62b. These memory banks each incorporate a memory array according to the invention, like the ones shown in FIGS. 9, 17, 19, or 31. In one embodiment, the memory circuit 60 is a synchronous DRAM (SDRAM), although it may be another type of memory in other embodiments.

Figure 18:
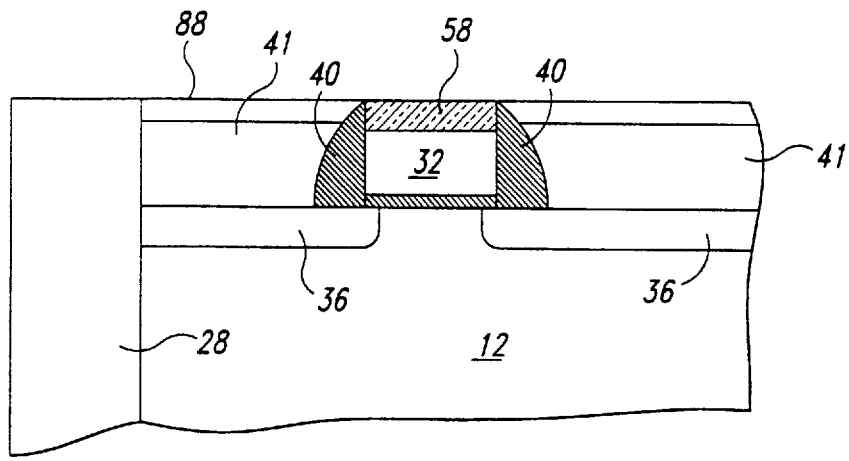
FIGS. 18–19 are cross-sectional views showing an embodiment of a method for forming sub-lithographic word lines in a memory array according to the invention.
Figure 19:
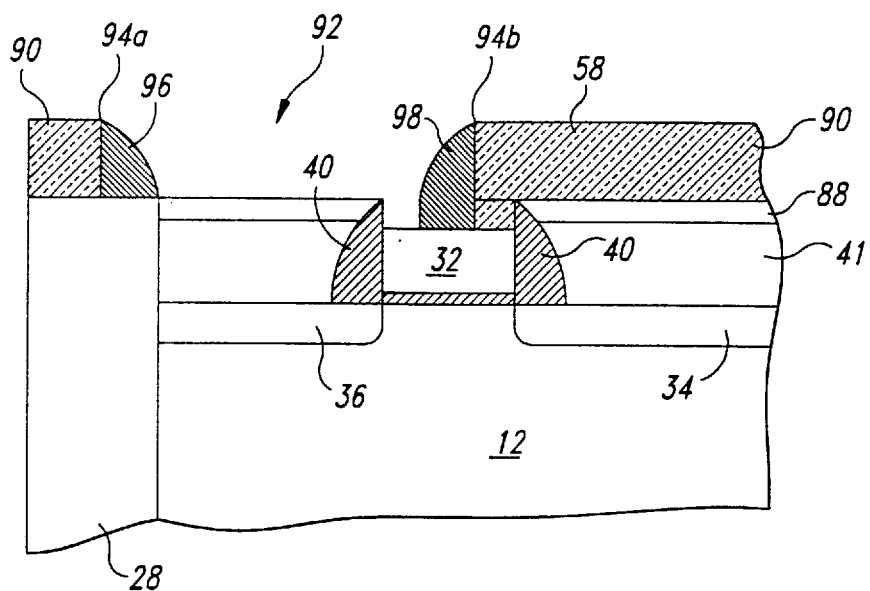

FIGS. 18 and 19 show one embodiment for forming sub-lithographic word lines for reduced-area memory arrays, such as those shown in FIGS. 9 and 17. Such sub-lithographic word lines have widths that are less than the minimum feature size of the process, and thus allow such memory arrays to be constructed with a folded-digit-line architecture without the word lines being electrically shorted together. Of course, such reduced-area memory arrays can be constructed with a shared-digit-line architecture using conventional process technology to form conventional word lines. Thus, the techniques shown in FIG. 18 and FIG. 19 are not required to form a shared-digit-line architecture.

FIG. 18 is a cross section of a portion of the memory array shown in FIG. 17, although it is understood that the formation of the sublithographic word lines for the memory array of FIG. 9 occurs in a similar manner. First, the conductive material 41 is conventionally etched back such that it becomes recessed with respect to the surface of the pad 58. In one embodiment, the material 41 is recessed approximately 100 nm. Next, an insulator layer 88, such as an oxide, is conventionally grown or deposited and then polished back to the surface of the pad 58 to give the structure shown in FIG. 18.

Referring to FIG. 19, which is a cross-sectional view, a mandrel 90 is conventionally formed on the layer 88 and the pad 58. In one embodiment, the mandrel 90 is formed from intrinsic, i.e., undoped, polysilicon. The mandrel is then conventionally polished to smoothen its upper surface. Next, a groove 92, which has sidewalls 94a and 94b, is conventionally etched into the mandrel 90. The sidewall 94a is over a midsection of the isolation segment 28, and the sidewall 94b is over a midsection of the gate segment 32. Then, a conventional anisotropic etch removes the exposed region of the pad 58, and thus exposes a region of the gate 32. Next, a conductive material such as polysilicon is conventionally formed in the groove 92. The conductive material is then anisotropically etched to leave conductive sidewalls that become the sub-minimum dimension word lines 96 and 98. In one embodiment, the mandrel 90 is then removed. In another embodiment, the mandrel 90 and the word lines 96 and 98 are conventionally polished or etched to make the shape of the word lines 96 and 98 rectangular, and to center the word line 98 over the respective gate 32.

FIGS. 20–31 show one embodiment of a method for forming tacked capacitors in a reduced-area memory array that is similar to those shown in FIGS. 9 and 17, where the memory array has the sub-lithographic word lines formed as discussed above in conjunction with FIGS. 18 and 19.

Figure 20:
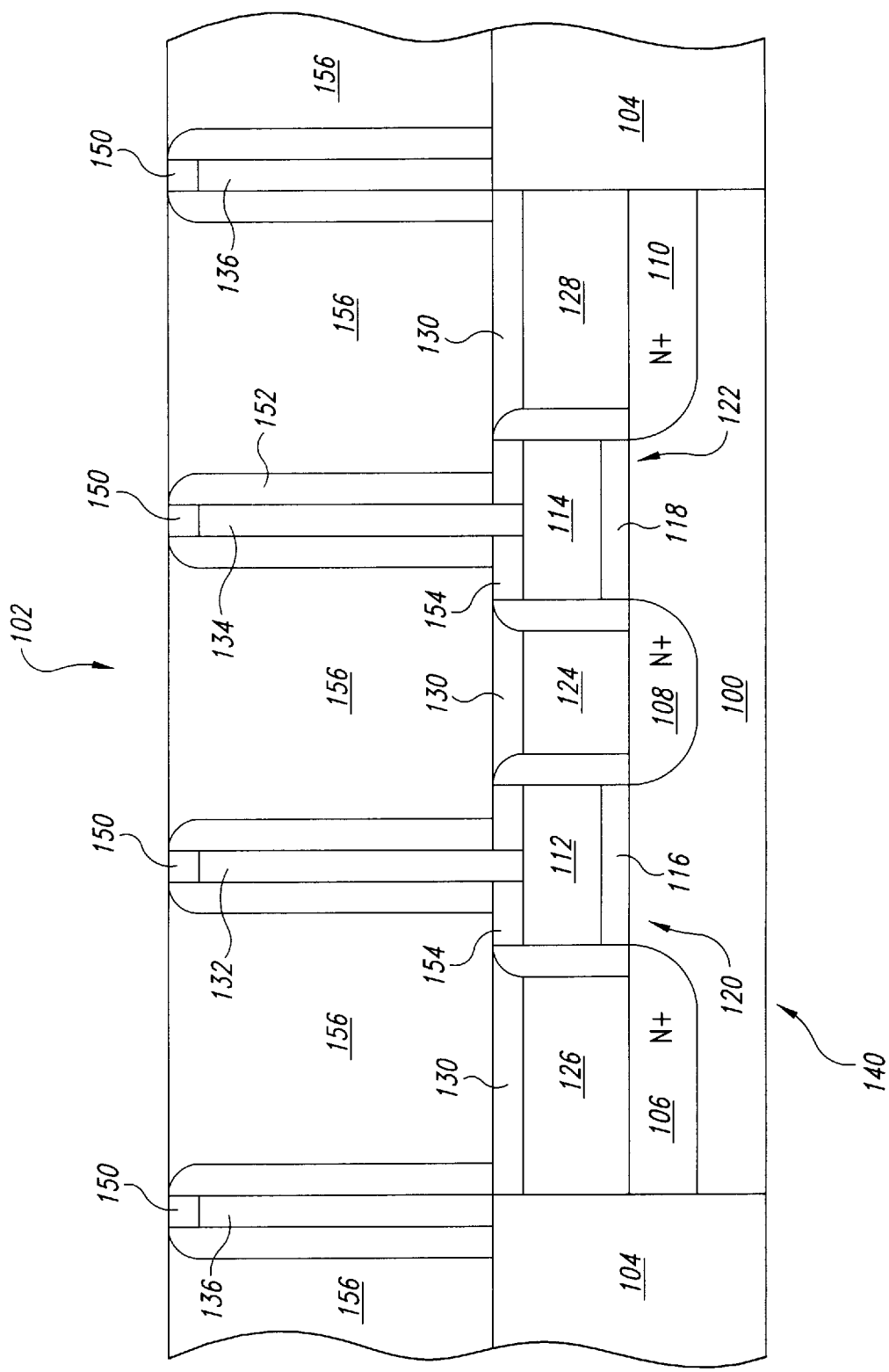

Referring to FIG. 20, a silicon substrate 100 provides a strong base for the semiconductor layers of a memory array 102. The isolation segments 104, which are similar to the segments 28 of FIG. 17, provide support and isolation between the devices in the array 102. N+ diffusion regions 106, 108, and 110, which are similar to the regions 36, 34, and 36 of FIG. 17, respectively, are formed by introducing any suitable N-type dopant into the substrate 100. The N-type dopant, such as phosphorous, is typically introduced by diffusion or ion implantation. The transistor gates 112 and 114, which are similar to the gates 32 of FIG. 17, typically comprise polysilicon, and are respectively separated from the substrate 100 by thin layers of gate oxide 116 and 118, which are similar to the layer 54 of FIG. 17, in order to limit the gate current to a negligible amount. In this configuration, the N+ diffusion region 106, gate 112, channel region 120, and N+ diffusion region 108 define a first transistor. Similarly, the N+ diffusion region 110, gate 114, channel region 122, and N+ diffusion region 108 define a second transistor.

The center N+ diffusion region 108 acts as a common source or drain, and the N+ diffusion regions 106 and 110 act as independent sources or drains depending upon the voltage applied to these regions. In one embodiment, the transistors of the array 102 are enhanced NMOS transistors. Alternatively, any transistor configuration suitable for memory-cell access may readily be used. Furthermore, these transistors are shown as exemplary only. In an alternate embodiment, any suitable semiconductor device may be formed in the substrate 100 without departing from the scope of the invention.

The array 102 includes contact regions that can be formed from any appropriate conductive material such as polysilicon. These contact regions are coupled to the N+ diffusion regions. For example, a contact region 124 is coupled to the N+ diffusion region 108, while contact regions 126 and 128 are coupled to the N+ diffusion regions 106 and 110, respectively. Contact insulating layers 130 include a conventional thin-film insulator such as silicon nitride and insulate the contact regions 124, 126, and 128.

The array 102 also includes word lines 132 and 134, which extend normal to the substrate 100 and are formed outwardly from the gates 112 and 114, respectively. These word lines are sub-lithographic word lines, and are thus similar to the word line 98 of FIG. 19. In one embodiment, the word lines 132 and 134 are formed from polysilicon, but in other embodiments, they are formed from other suitable conductive materials such as conventional metals.

The sub-lithographic, edge-defined word lines 132 and 134 are formed outwardly from the device gates 112 and 114 in a manner similar to that described above in conjunction with FIGS. 18 and 19. "Passing" word lines 136, which are similar to the word line 96 of FIG. 19, form a second pair of word lines that provide a conductive path to adjacent memory cells in the array 102.

Figure 21A:
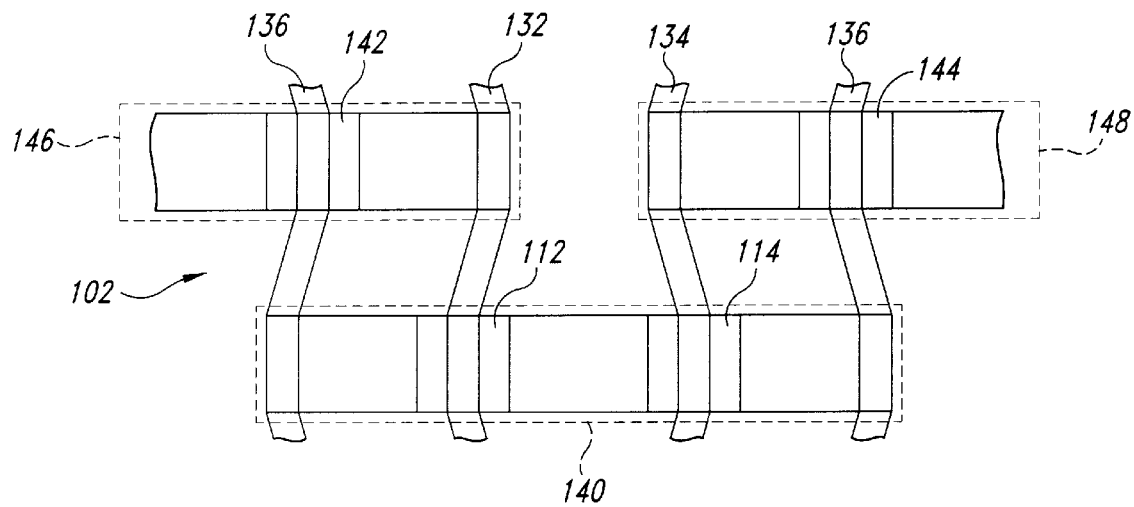
FIGS. 21A, 21B, and 23B are top plan views.

FIG. 21A, which is a top view of the integrated circuit 102, shows the interconnection of the memory cells of the array 102. Specifically, FIG. 21A shows how the word lines 132 and 134 are coupled to the gates 112 and 114, respectively, within a memory cell 140. FIG. 21A also shows how the passing conductors 136 pass through the memory cell 140 and are coupled to the device gates 142 and 144 of adjacent memory cells 146 and 148, respectively. Note that the memory cells 146 and 148 are only partially shown.

Referring again to FIG. 20, the word lines 132 and 134 are capped with an insulator 150 and are lined with a sidewall insulator 152. An insulator 154 insulates the gates 112 and 114. Any suitable semiconductor insulator material, such as silicon dioxide, may be used for the insulators 150, 152, and 154. For example, referring to FIGS. 19 and 20, after the mandrel 90 is removed, an oxide layer is CVD deposited and directionally etched to form the insulator linings 152. Then, intrinsic polysilicon 156 is deposited and conventionally polished back along with the top portions of the linings 152, such that the tops of the word lines 132, 134, and 136 are exposed. Then, a thermal oxide is grown on these exposed portions to form the caps 150, and the structure is again polished back to give the structure shown in FIG. 20.

In order to form stacked capacitors outwardly from the substrate 100, a material with a high degree of etch selectivity is used. As discussed above, this suitable material, such as the intrinsic polysilicon 156, is deposited between the word lines 132 and 134 and the passing word lines 136 by a conventional process such as CVD. The high degree of etch selectivity of a material such as intrinsic polysilicon 156 is advantageous because it allows intricate etching without disturbing the surrounding semiconductor regions.

Figure 21B:
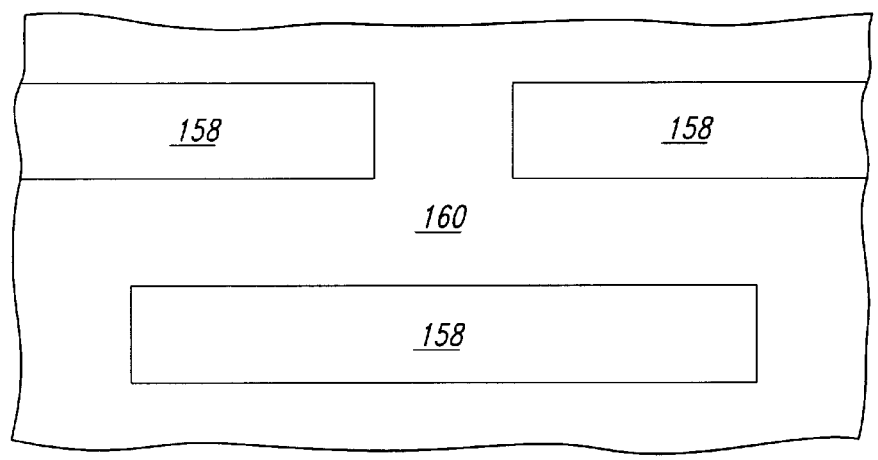

Referring to FIG. 21 B, which is a top plan view, a photoresist and a mask are used to reveal the plurality of semiconductor memory cells formed on the substrate 100. First, a photoresist is applied to the entire array 102. Masked areas 158 illustrate the areas of the photoresist 160 that are covered by a mask and therefore are not hardened when exposed to ultraviolet light. After exposing the resist and the mask, the intrinsic polysilicon 156 between the word lines 132 and 134 and the passing word lines 136 is removed by selectively etching the intrinsic polysilicon 156.

Figure 22:
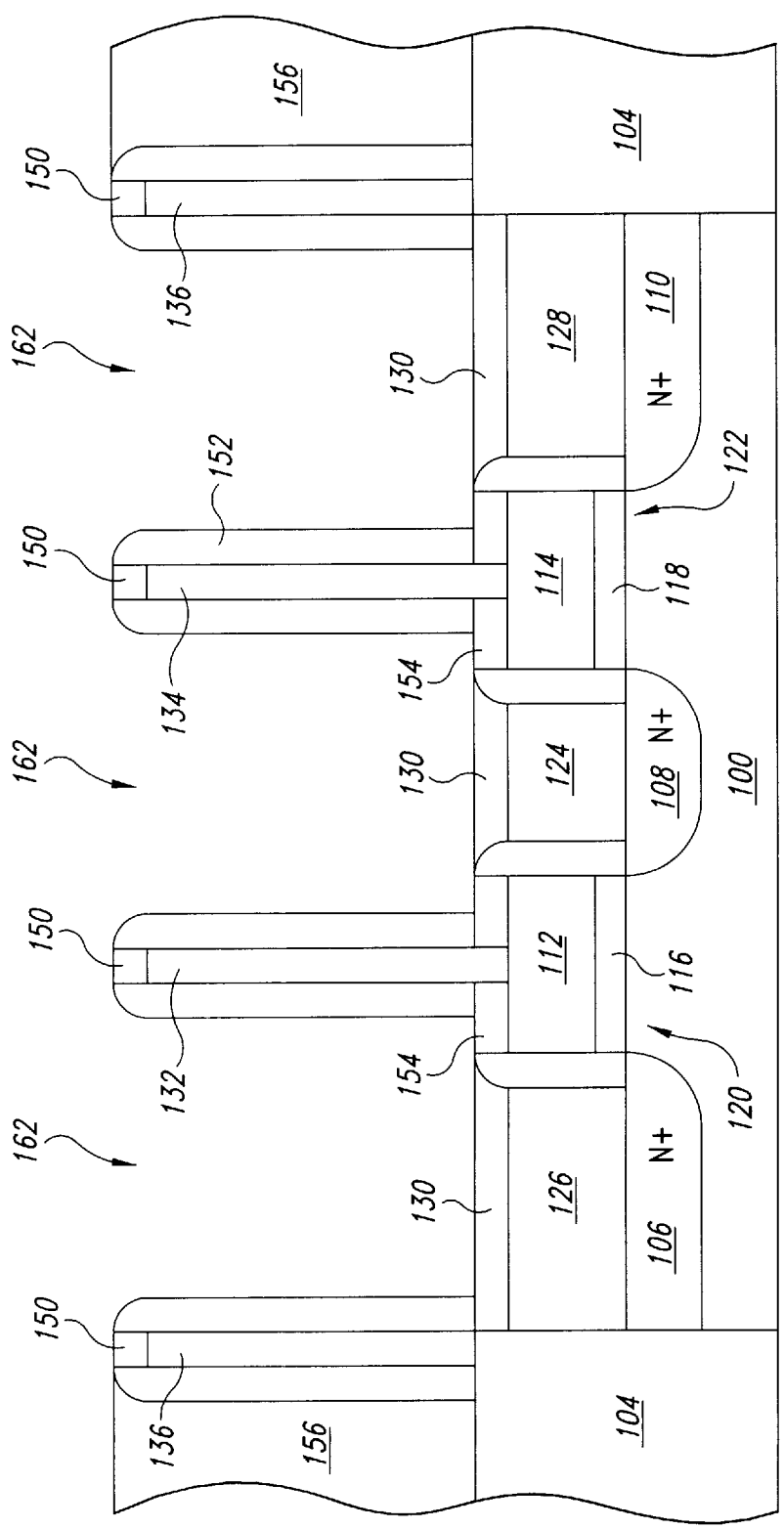

Referring to FIG. 22, three stud holes 162 are created in the array 102. The stud holes 162 extend into the array 102 and toward the substrate 100, and ultimately expose the contact insulating layers 130. The regions of the intrinsic polysilicon 156 that are covered by the mask are not etched.

Figure 23A:
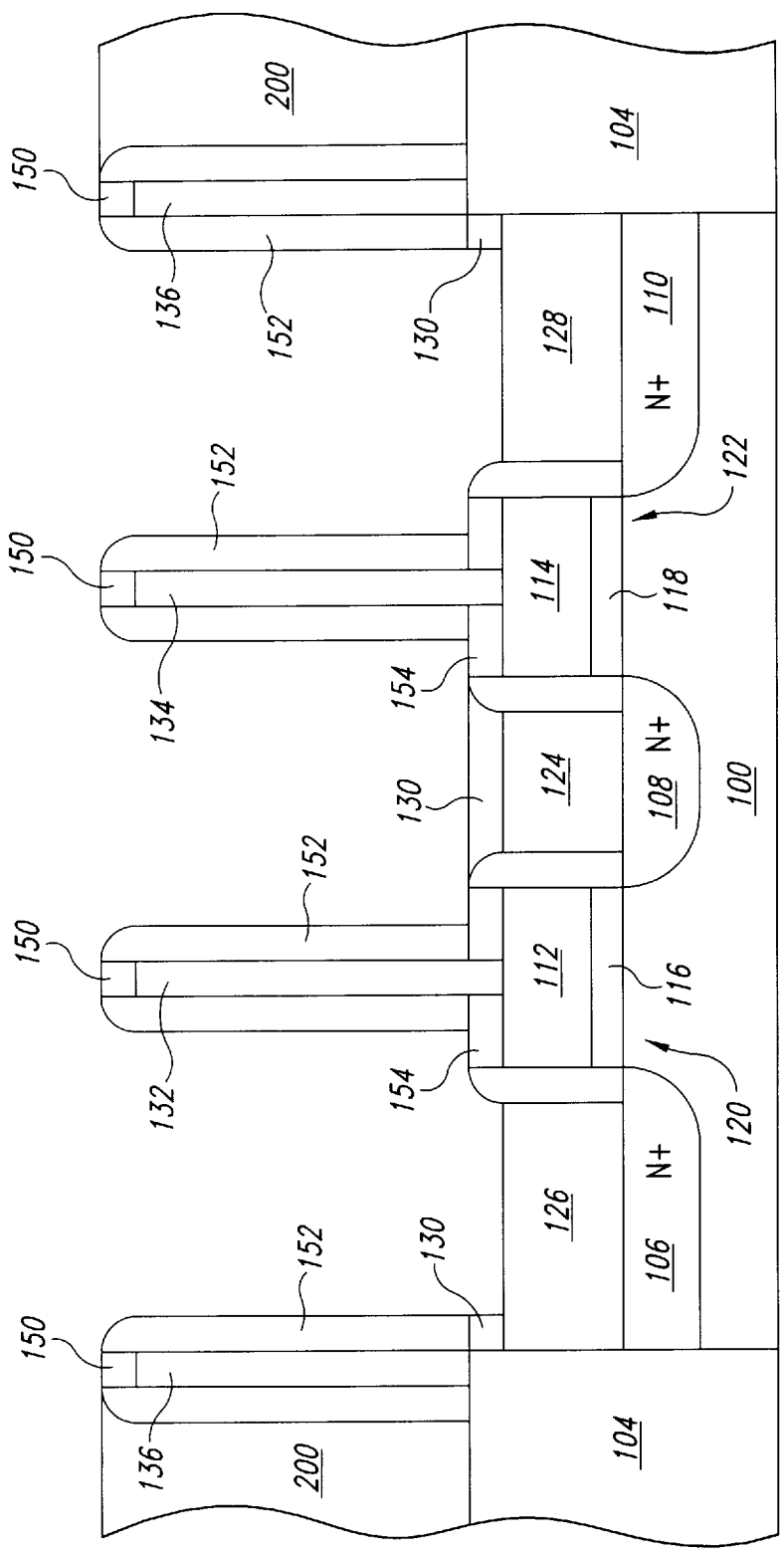

Referring to FIG. 23A, which is a cross-sectional view, a second mask is formed that allows the layers 130 that overly the layers 126 and 128 to be etched, thus exposing the regions 126 and 128. Small regions of the layers 130 remain between the insulator 152 adjacent to the passing word lines 136 and the contact regions 126 and 128, respectively. The second mask is then removed.

Figure 23B:
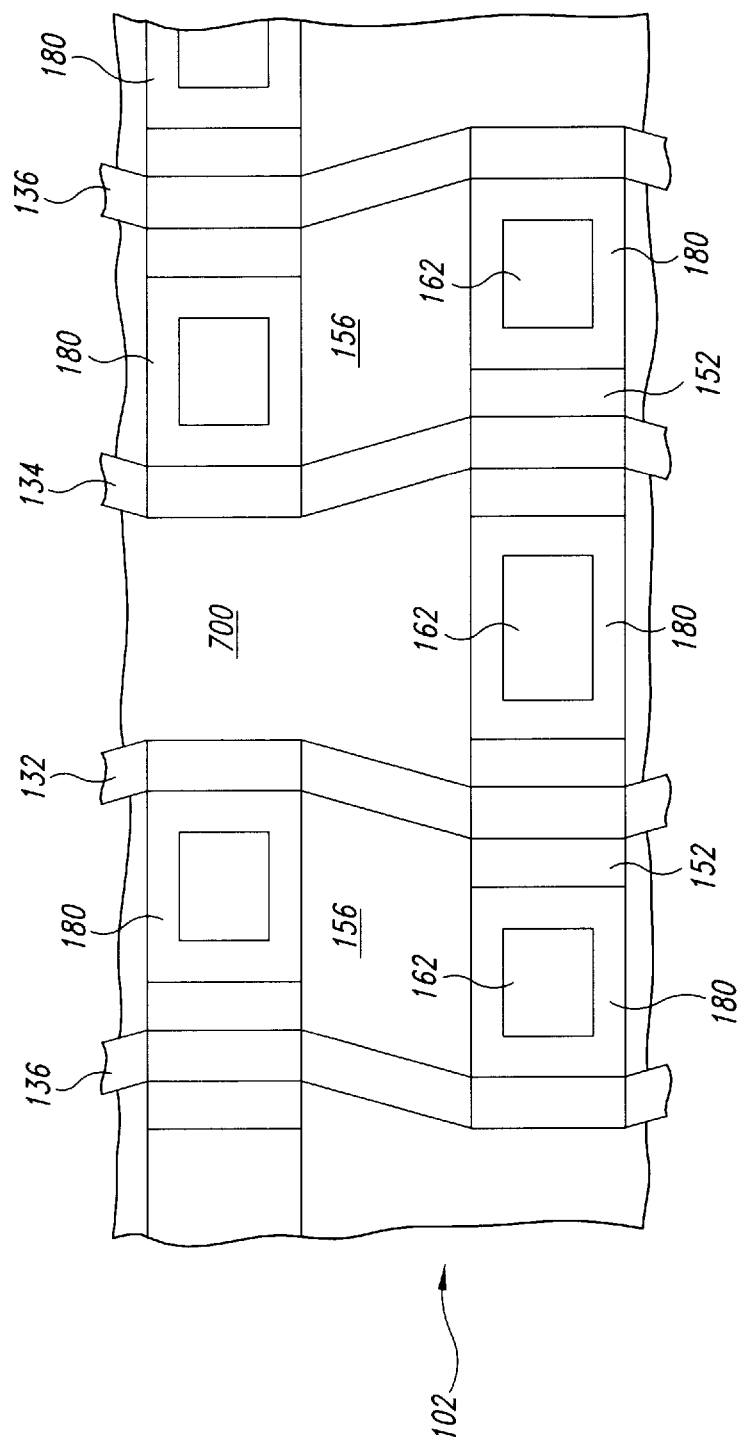

Referring to FIG. 23B, which is a top view of the array 102 after the contact regions 126 and 128 are exposed, an insulator, such as silicon dioxide, is CVD deposited on the walls of the openings between the word lines 132 and 134 and the passing conductors 136. This step creates sleeves 180, which line the insulator 152 and the intrinsic polysilicon 156, but which cover the exposed surfaces of the contact regions 126 and 128. These sleeves 180 are advantageous because they reduce the sizes of the stud holes 162, and thus reduce the parasitic capacitances of the conductive connections between the active regions of the substrate 100 and the stacked capacitors that will be formed.

The formation of the sleeves 180 is followed by an anisotropic etch, such as a dry reactive ion etch (RIE), that removes the recently deposited oxide from all horizontal surfaces but leaves it on the vertical surfaces. This removes the insulator from the recently exposed contact regions 126 and 128. It is necessary to correctly time the etch so that it does not inadvertently etch the horizontal oxide layers 154, which insulate the bases of the word lines 132 and 134 and the gates 112 and 114. Thus, as a result of the directional etch, the stud holes 162 are aligned with the insulating sleeve 180.

Figure 24A:
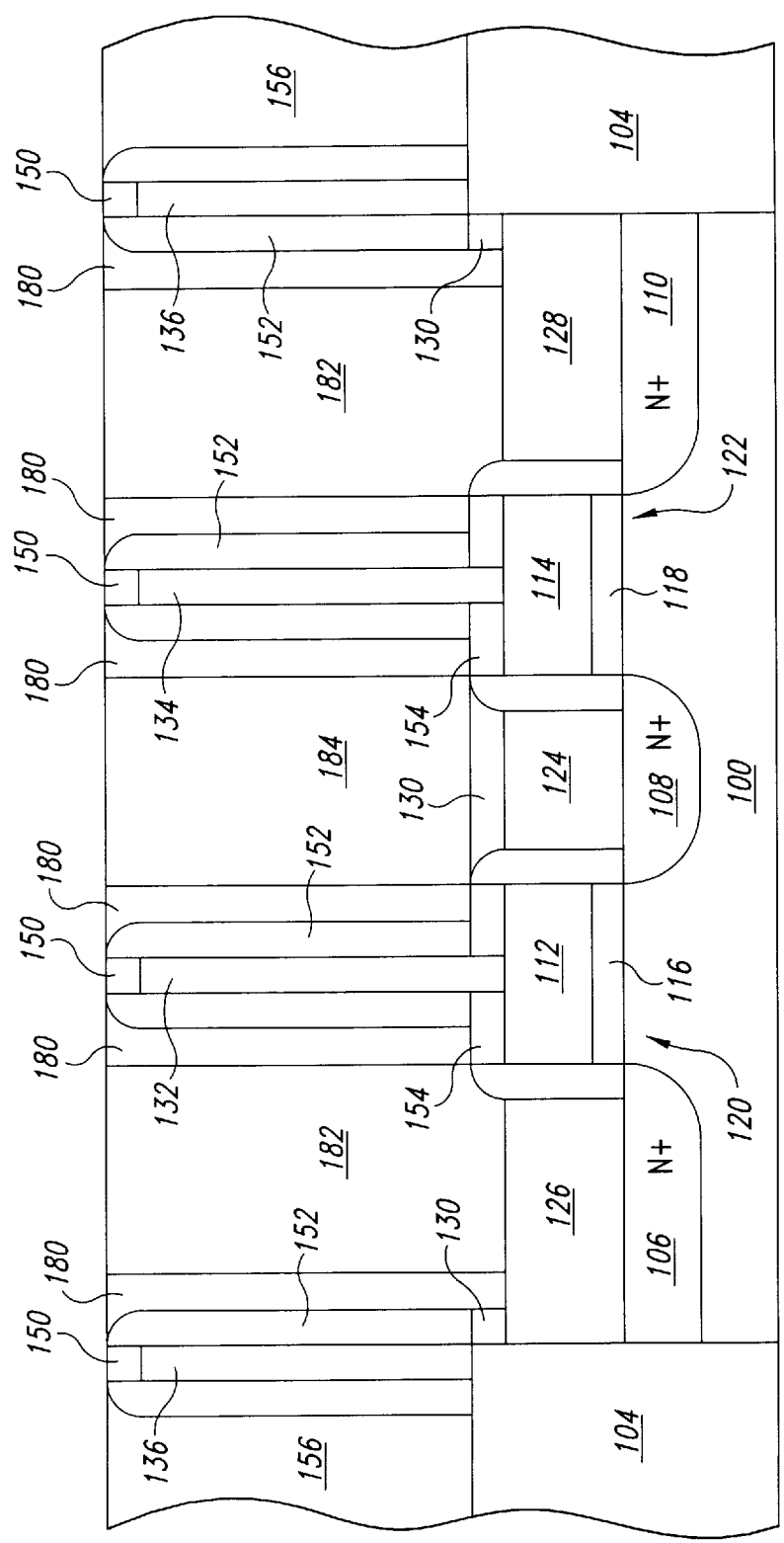

Referring to FIG. 24A, which is a cross-sectional view, the next step is to fill the two side stud holes 162 with a conductive material, such as doped polysilicon 182, by conventional CVD. Then, an insulating material, such as silicon dioxide 184, is conventionally deposited in the center stud hole 162. The doped polysilicon 182 and the oxide 184 are conventionally polished so that they are substantially flush with the oxide caps 150. The doped polysilicon 182 provides conductive paths to the contact regions 126 and 128, respectively. In this manner, the conductive paths formed by the doped polysilicon 182 are bounded by the word lines 132 and 134 and the passing word lines 136. One difference between this structure and that which could be used where the digit lines are not buried but are formed in an upper conductive layer is that here, the center contact region 124, because it is connected to the buried digit line, can be covered with the oxide 184 instead of being filled with a conductive material that will eventually form a conductive digit-line via.

Figure 24B:
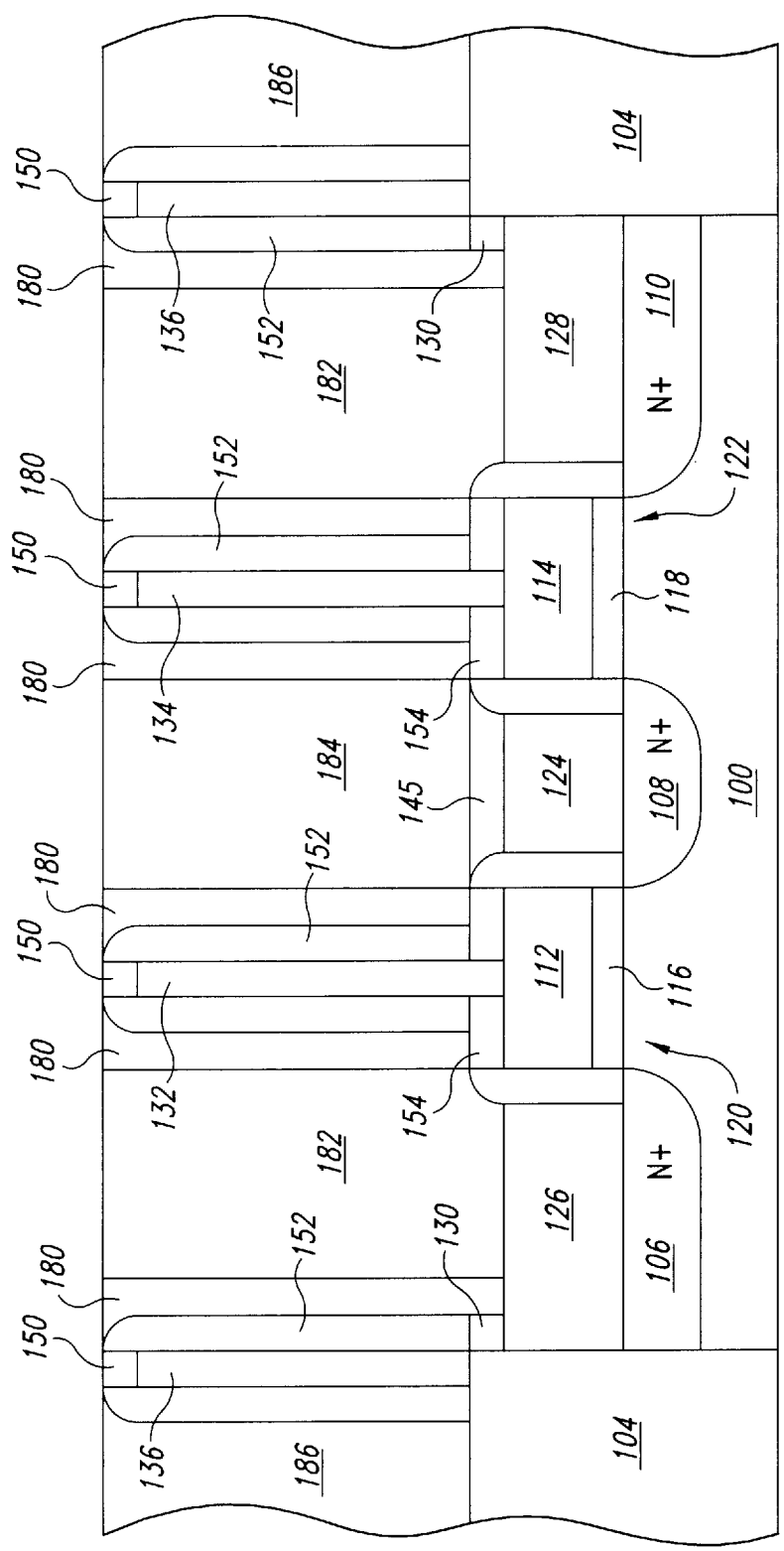

Referring to FIG. 24B, which is a cross-sectional view, the remaining portions of the intrinsic polysilicon 156 that were hidden by the mask 160 are selectively etched. An insulator 186, which may be any conventional insulator, such as silicon dioxide, is deposited on the entire wafer to fill the void regions where the intrinsic polysilicon 156 was removed. The insulator 186 is then conventionally polished so that it is substantially planar with the oxide caps 150, the doped polysilicon regions 182, and the oxide region 184. The resulting formation as shown in FIG. 24B is virtually identical to that shown in FIG. 24A, with the exception that the intrinsic polysilicon 156 has been replaced with the oxide filler 186.

At this point in the fabrication of the stacked capacitors, the process has effectively provided conductive paths to the active regions of the substrate, where these conductive paths are disposed between the sub-lithographic word lines. The remaining steps in the process as discussed below form the stacked capacitors.

Figure 25:
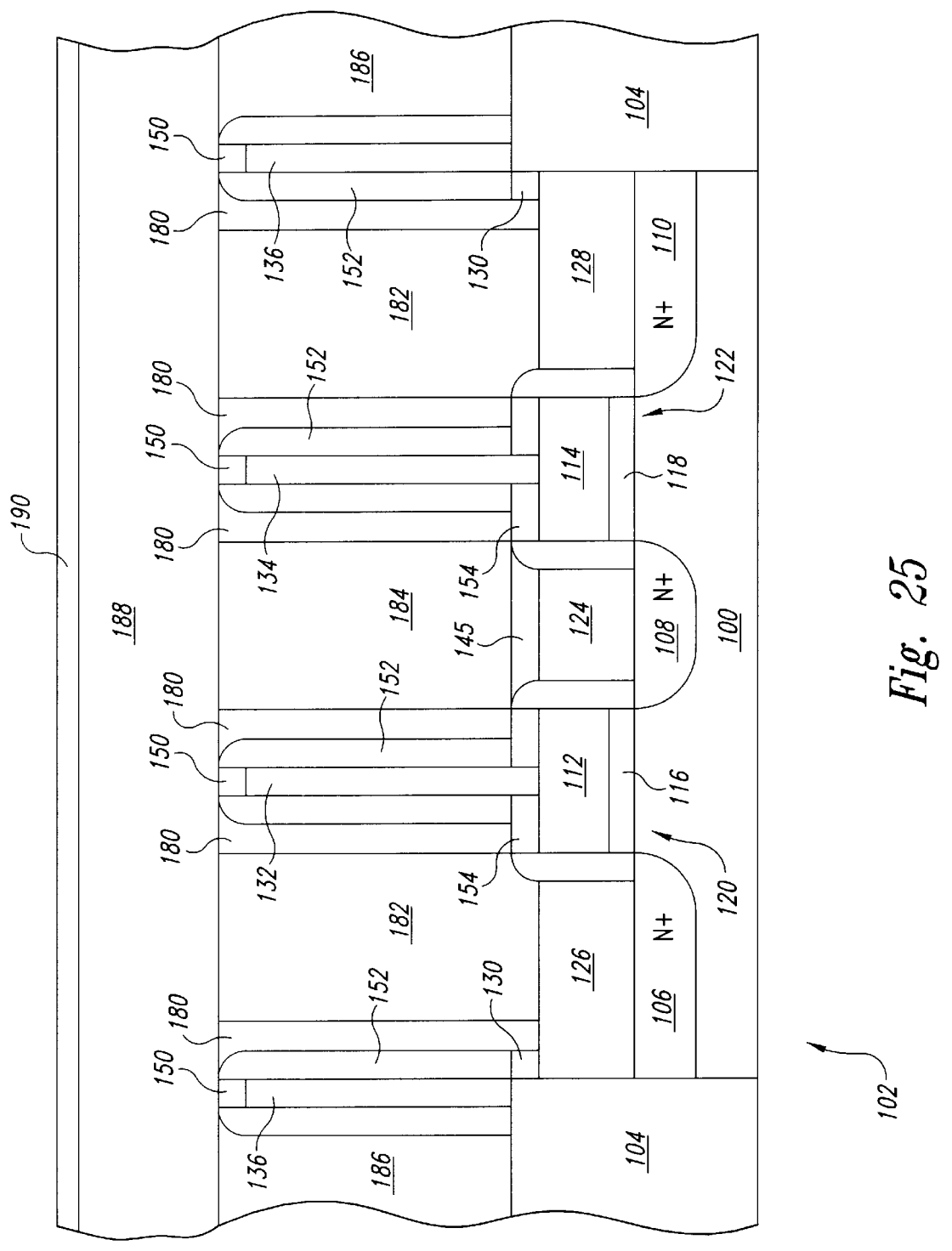

Referring to FIG. 25, which is a cross-sectional view, a thick layer of intrinsic polysilicon 188 is CVD deposited on the entire wafer. This layer should be at least 0.5 $\mu$m thick. Next, a thin mask 190 is created by depositing a conventional thin-film insulator, such as silicon nitride, on the thick layer of intrinsic polysilicon 188. The thin mask 190 should be approximately 500 angstroms thick.

Figure 26:
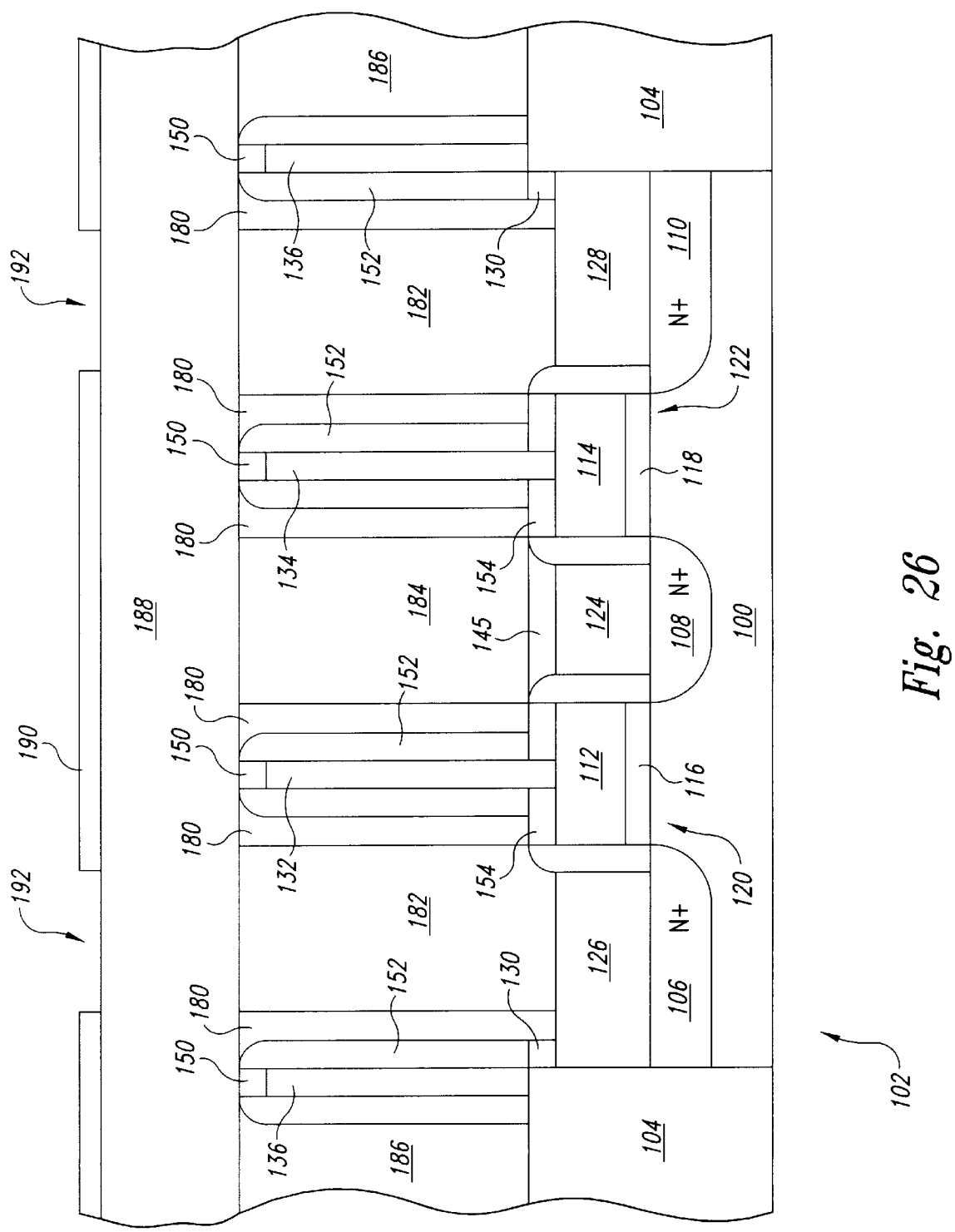

Referring to FIG. 26, which is a cross-sectional view, a resist is applied to the wafer and is used to define openings 192 over the doped polysilicon 182. These outer openings 192 will be used to form the stacked capacitors. Therefore, in one embodiment, the sizes and shapes of the outer openings 192 are designed to maximize the capacitor size and minimize the contact size.

Figure 27:
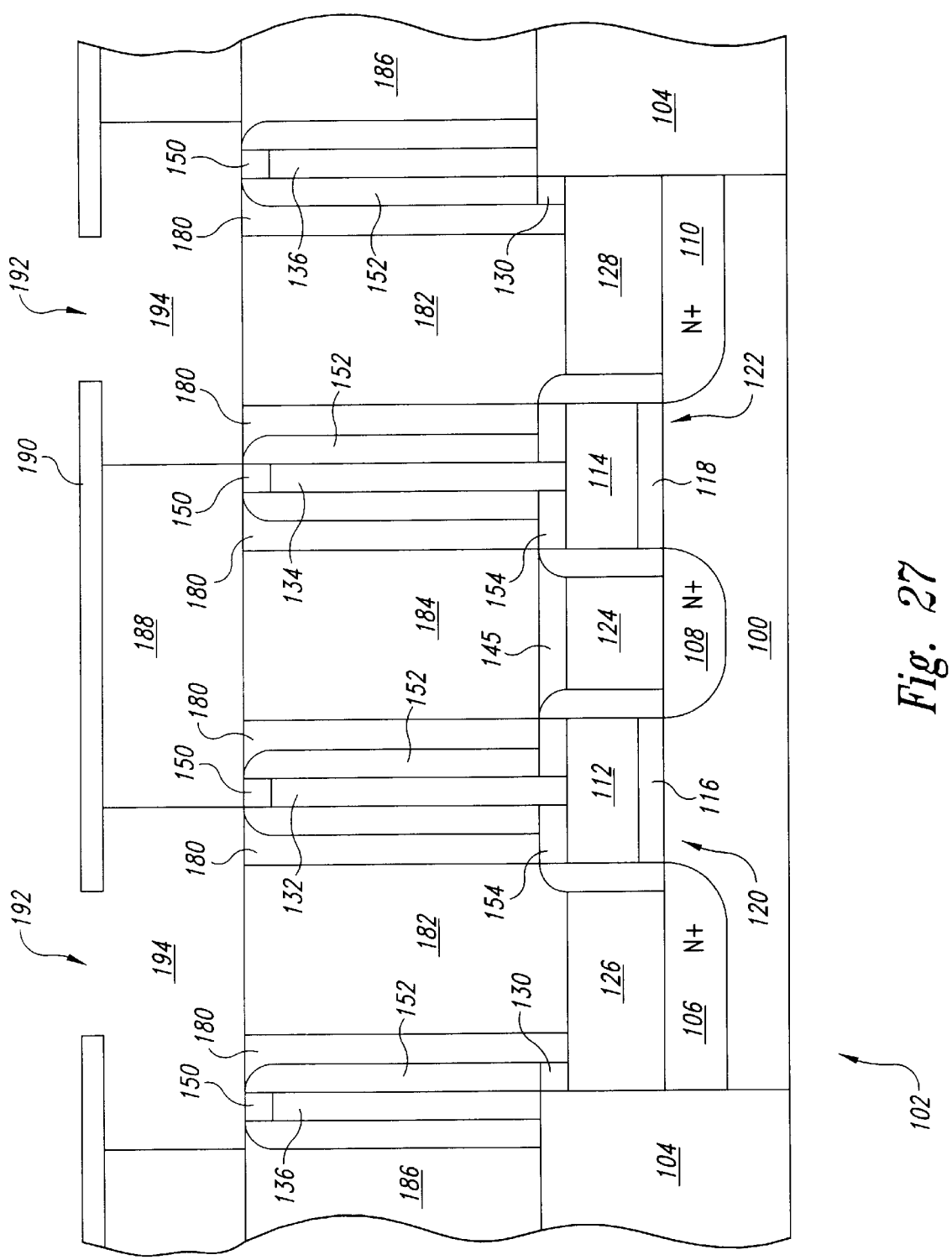

Referring to FIG. 27, which is a cross-sectional view, the intrinsic polysilicon 188 is etched to create two hollow regions 194. During this step, the thin-film insulator 190 acts as a mask, so a new mask and resist need not be applied. In one embodiment, this etch has an isotropic component, such that it is slightly nondirectional. The isotropic component effectively enlarges the size of the hollow regions 194 relative to the outer holes 192 in the insulator 190. After etching, the thin mask layer 190 is removed.

Figure 28:
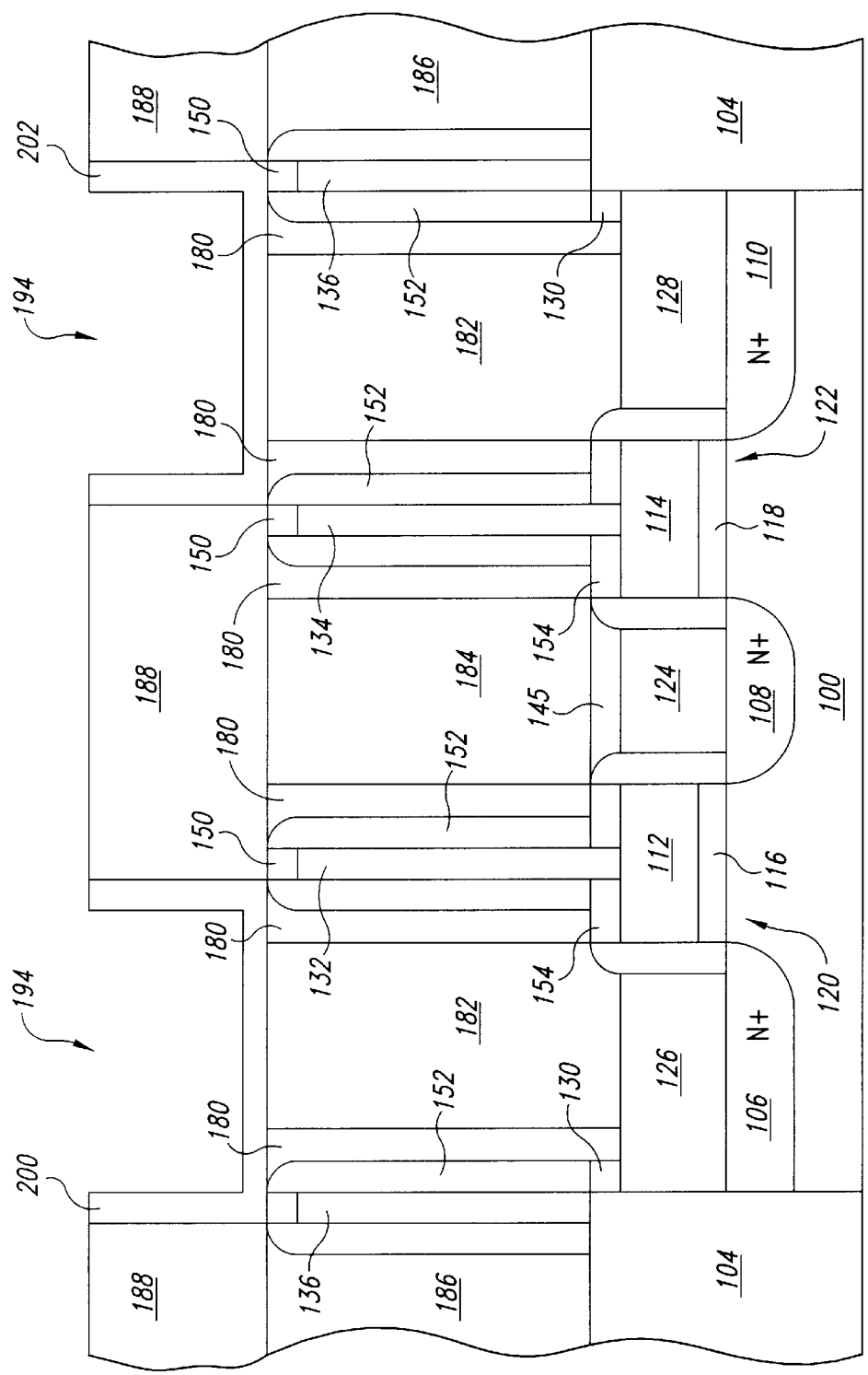

Referring to FIG. 28, which is a cross-sectional view, a conductive material, such as N+ polysilicon, is deposited on the array 102. The conductive material forms conductive liners in the regions 194. These liners are the respective bottom plates 200 and 202 for the stacked capacitors. After forming the plates 200 and 202, the N+ polysilicon is conventionally polished to guarantee that the plates 200 and 202 are not shorted together over the intrinsic polysilicon 188.

Figure 29:
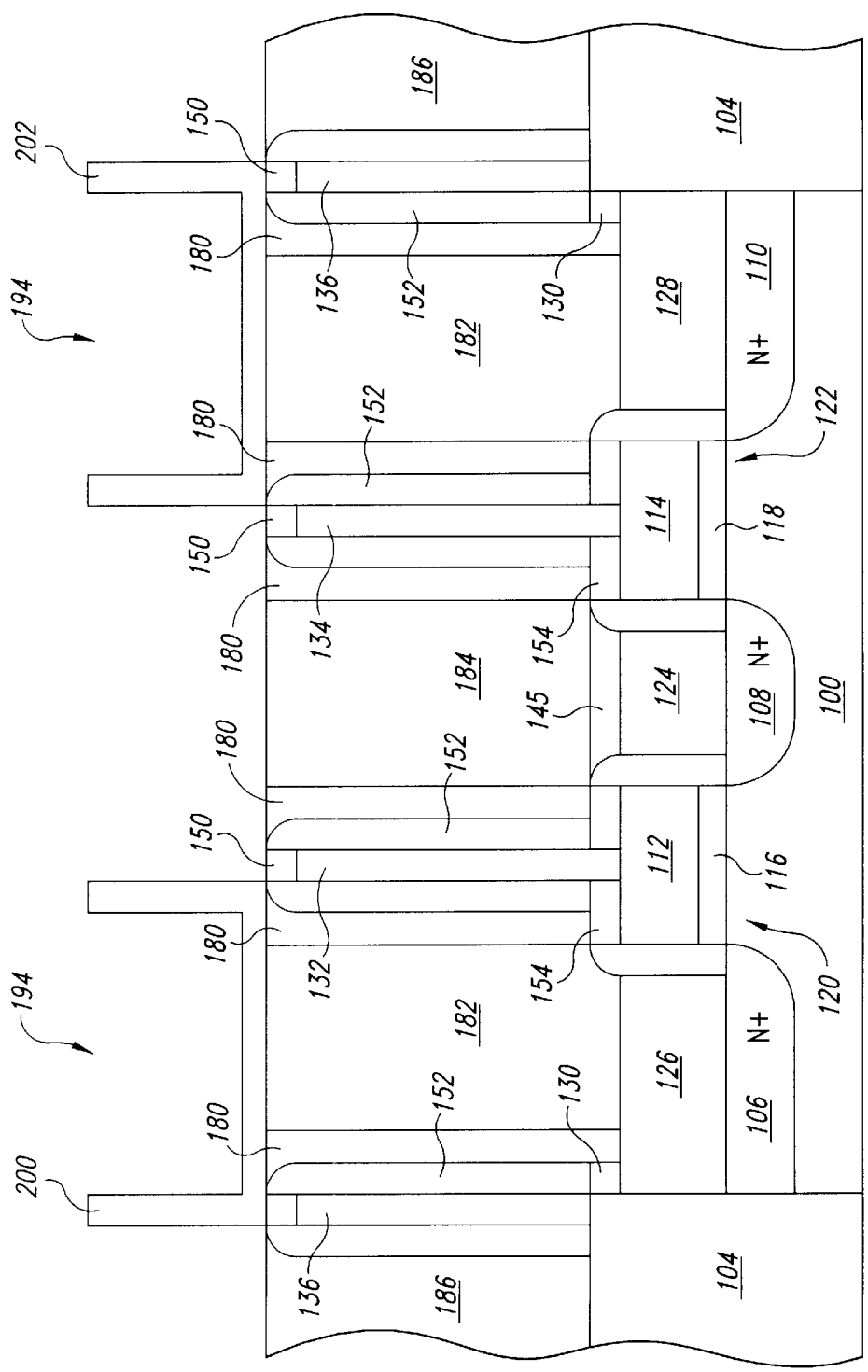

Referring to FIG. 29, which is a cross-sectional view, the remaining intrinsic polysilicon 188 is selectively etched in a conventional manner after the conductive material that forms the plates 200 and 202 is polished. This step exposes the oxide filler 186, as well as the oxide 184.

Figure 30:
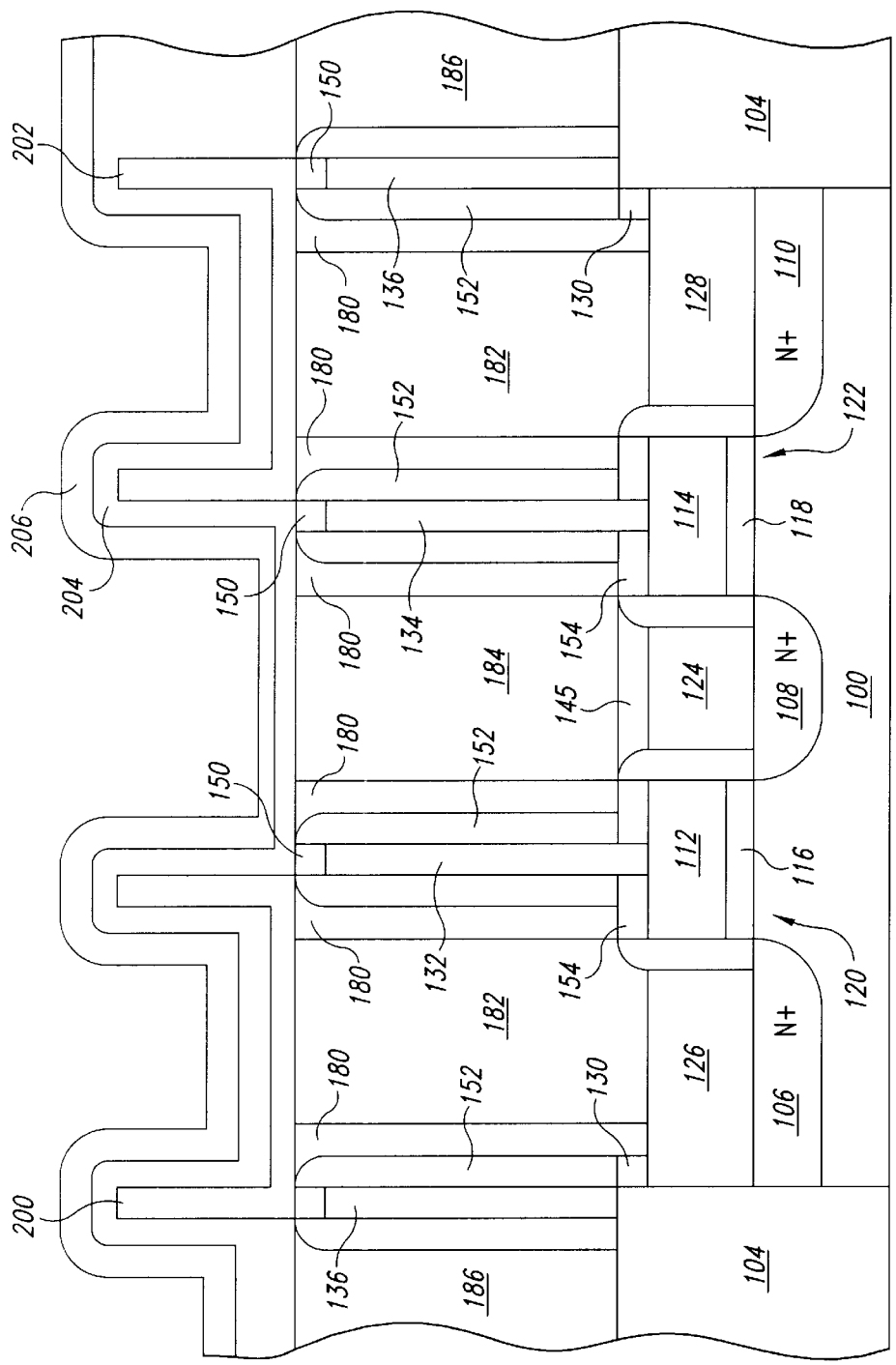

Referring to FIG. 30, which is a cross-sectional view, a dielectric material 204, which is any suitable dielectric material, such as tantalum pentoxide, is deposited. In other embodiments, any suitable dielectric material may be used. Next, an upper plate conductor 206 is deposited on the dielectric material 204. In one embodiment, platinum is used as the plate conductor 206. In other embodiments, any suitable conductor may be used.

Referring to FIG. 31, which is a cross-sectional view, an insulator 210, which is any suitable insulator, such as silicon dioxide, is deposited after the capacitor materials are formed. The insulator 210 is then conventionally polished to smoothen its surface.

Although in the illustrated embodiment the bottom plates 200 and 202 of the capacitors are shown to not extend over the oxide 184, in another embodiment, these plates extend over the oxide 184 to increase the plate area, and thus the capacitance of, the stacked capacitors. In yet another embodiment, the space between the word lines 132 and 134 may be reduced, thus reducing the width of the memory cells and the overall area of the memory array 102.

The memory circuit 60 includes an address register 64, which receives an address from an ADDRESS bus. A control logic circuit 66 receives a clock (CLK) signal receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory device 60. A row-address multiplexer 68 receives the address signal from the address register 64 and provides the row address to the row-address latch-and-decode circuits 70a and 70b for the memory bank 62a or the memory bank 62b, respectively. During read and write cycles, the row-address latch-and-decode circuits 70a and 70b activate the word lines of the addressed rows of memory cells in the memory banks 62a and 62b, respectively. Read/write circuits 72a and 72b read data from the addressed memory cells in the memory banks 62a and 62b, respectively, during a read cycle, and write data to the addressed memory cells during a write cycle. A column-address latch-and-decode circuit 74 receives the address from the address register 64 and provides the column address of the selected memory cells to the read/write circuits 72a and 72b. For clarity, the address register 64, the row-address multiplexer 68, the row-address latch-and-decode circuits 70a and 70b, and the column-address latch-and-decode circuit 74 can be collectively referred to as an address decoder.

A data input/output (I/O) circuit 76 includes a plurality of input buffers 78. During a write cycle, the buffers 78 receive and store data from the DATA bus, and the read/write circuits 72a and 72b provide the stored data to the memory banks 62a and 62b, respectively. The data I/O circuit 76 also includes a plurality of output drivers 80. During a read cycle, the read/write circuits 72a and 72b provide data from the memory banks 62a and 62b, respectively, to the drivers 80, which in turn provide this data to the DATA bus.

A refresh counter 82 stores the address of the row of memory cells to be refreshed either during a conventional auto-refresh mode or self-refresh mode. After the row is refreshed, a refresh controller 84 updates the address in the refresh counter 82, typically by either incrementing or decrementing, the contents of the refresh counter 82 by one. Although shown separately, the refresh controller 84 may be part of the control logic 66 in other embodiments of the memory device 60.

The memory device 60 may also include an optional charge pump 86, which steps up the power-supply voltage $V_{DD}$ to a voltage $V_{DDP}$. In one embodiment, the pump 86 generates $V_{DDP}$ approximately 1–1.5 V higher than $V_{DD}$. The memory circuit 60 may also use $V_{DDP}$ to conventionally overdrive selected internal transistors.

Figure 33:
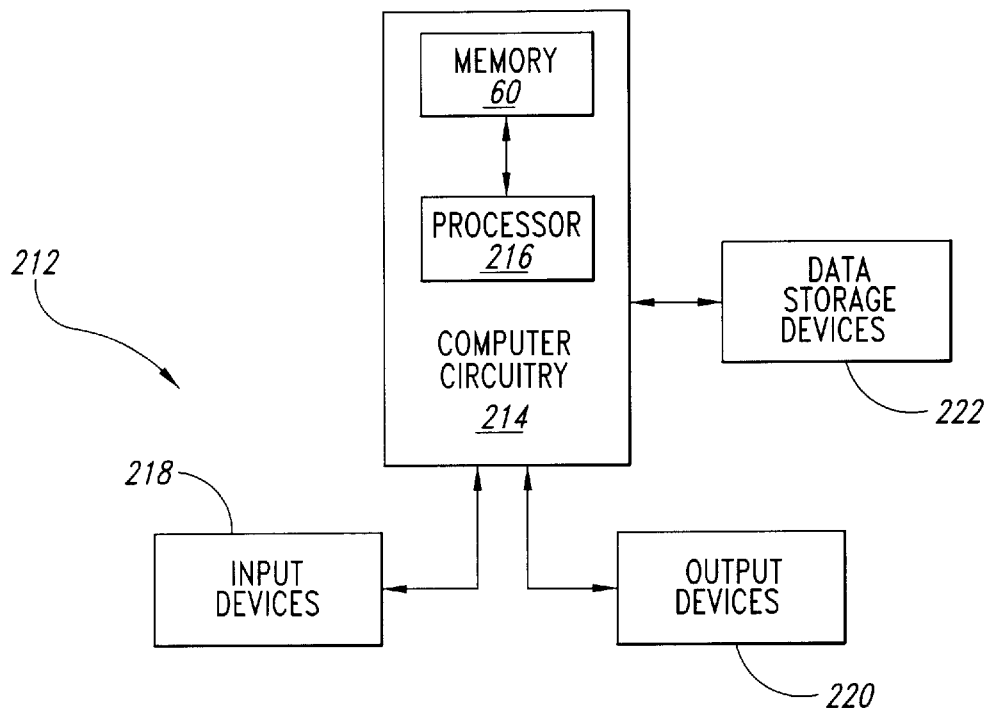
FIG. 33 is a block diagram of an electronic system that incorporates a memory circuit according to the invention.

FIG. 33 is a block diagram of an electronic system 212, such as a computer system, that incorporates the memory circuit 60 of FIG. 32. The system 212 also includes computer circuitry 214 for performing computer functions, such as executing software to perform desired calculations and tasks. The circuitry 214 typically includes a processor 216 and the memory circuit 60, which is coupled to the processor 216. One or more input devices 218, such as a keyboard or a mouse, are coupled to the computer circuitry 214 and allow an operator (not shown) to manually input data thereto. One or more output devices 220 are coupled to the computer circuitry 214 to provide to the operator data generated by the computer circuitry 214. Examples of such output devices 220 include a printer and a video display unit. One or more data-storage devices 222 are coupled to the computer circuitry 214 to store data on or retrieve data from external storage media (not shown). Examples of the storage devices 222 and the corresponding storage media include drives that accept hard and floppy disks, tape cassettes, and compact disk read-only memories (CD-ROMs). Typically, the computer circuitry 214 includes address data and command buses and a clock line that are respectively coupled to the ADDRESS, DATA, and COMMAND buses, and the CLK line of the memory device 60.

From the foregoing it will be appreciated that, although specific embodiments of the invention have been described herein for purposes of illustration, various modifications may be made without deviating from the spirit and scope of the invention. For example, although the invention is described with respect to digit lines in a memory circuit, other types of conductors, such as world lines or other circuit interconnections, can be formed in the isolation trenches of other types of circuits. Thus, in these other circuits, the invention can be used to add another layer of wiring with little or no increase in the layout area. Accordingly, the invention is not limited except as by the appended claims.

I claim:

1. A memory array, comprising:
   a semiconductor substrate;
   an isolation trench disposed in the substrate and having first and second opposite sides;
   a conductor disposed in the trench;
   a first memory cell disposed in the substrate adjacent to the first side of the trench, the first memory cell being coupled to the conductor; and
   a second memory cell disposed in the substrate adjacent to the second side of the trench.

2. The memory array of claim 1 wherein the first memory cell comprises a pair of source/drain regions disposed in the substrate, one of the regions being coupled to the conductor.

3. The memory array of claim 1, further comprising:
   the first memory cell including first and second source/drain regions disposed in the substrate; and
   an electrically conductive strap disposed on the first source/drain region and on the conductor.

4. The memory array of claim 1 wherein the second memory cell is electrically isolated from the conductor.

5. A memory array, comprising:
   a semiconductor substrate;
   isolation trenches disposed in the substrate;
   digit lines each disposed within a respective one of the trenches;
   isolation segments disposed in the substrate between adjacent ones of the trenches;
   pairs of adjacent memory cells, each pair bordered by a respective pair of isolation segments and a respective pair of isolation trenches, each pair including a shared source/drain region that is disposed in the substrate; and
   straps that each electrically couple the shared source/drain region of a respective pair of cells to a respective digit line.

6. The memory array of claim 5, further comprising a dielectric material disposed in the isolation trenches and encapsulating the digit lines, the dielectric material having openings where the straps contact a respective digit line.

7. The memory array of claim 5 wherein:
   the digit lines and straps comprise polysilicon; and
   the isolation segments comprise an oxide.

8. The memory array of claim 5 wherein:
   the trenches are substantially parallel to one another; and
   the isolation segments are substantially parallel to one another and are substantially orthogonal to the trenches.

9. The memory array of claim 5, further comprising:
   the memory cells each including,
      a gate insulator disposed on the substrate and adjacent to the shared source/drain region, and
      a gate disposed on the gate insulator; and
   word lines that are coupled to the gates of the memory cells according to a folded-digit-line layout.

10. A memory circuit, comprising:
    a semiconductor substrate;
    substantially parallel isolation trenches that are disposed in the substrate;
    digit lines that are respectively disposed within the trenches;
    trench insulators that are disposed within the trenches and on the digit lines, the trench insulators having openings that expose portions of the digit lines;
    substantially parallel isolation segments that are disposed in the substrate substantially orthogonally to the trenches such that first segments that are adjacent to a first side of a trench are offset approximately half way between second segments that are adjacent to a second side of the trench;
    active areas that are defined in the substrate and bounded by the trenches and segments;
    pairs of memory cells that are each disposed in a respective one of the active areas, each pair of cells including a common source/drain region that is disposed in the substrate and that is substantially adjacent to an exposed portion of a respective digit line, each cell of the pair including a gate insulator that is disposed on the substrate and that is substantially contiguous with the common region, each cell of the pair including a gate disposed on the gate insulator; and
    conductive straps that are each connected between the common source/drain region of a respective pair of memory cells and the exposed portion of the respective digit line.

11. The memory circuit of claim 10 wherein the substrate comprises silicon.

12. The memory circuit of claim 10, further comprising word lines that are each respectively coupled to memory cells that are adjacent to the first side of a respective trench and to memory cells that are adjacent to the second side of the trench.

13. The memory circuit of claim 10, further comprising;
    first word lines that are each respectively coupled only to memory cells that are adjacent to the first side of a respective trench; and
    second word lines that are each respectively coupled only to memory cells that are adjacent to the second side of the trench.

14. The memory circuit of claim 10, further comprising substantially straight word lines that are each coupled to a respective row of the memory cells.

15. The memory circuit of claim 10, further comprising word lines that are each coupled to a respective group of aligned memory cells that form a row.

16. The memory circuit of claim 10, further comprising word lines that are each coupled to a respective row of the memory cells, the word lines each having a sub-lithographic dimension.

17. A memory device, comprising:
    address, data, and command busses;
    a bank of memory cells arranged in rows and columns, the bank comprising,
       a semiconductor substrate,
       an isolation trench disposed in the substrate and having first and second opposite sides,
       a digit line disposed in the trench,
       a first memory cell disposed in the substrate adjacent to the first side of the trench, the first memory cell being coupled to the digit line, and
       a second memory cell disposed in the substrate adjacent to the second side of the trench;
    an address decoder coupled to the address bus and to the bank;
    a read/write circuit coupled to the address decoder and to the digit line;

a data input/output circuit coupled to the data bus and to the read/write circuit; and a control circuit coupled to the command bus, to the address decoder, to the read/write circuit, and to the data input/output circuit.

18. The memory device of claim 17 wherein the first memory cell comprises a pair of source/drain regions disposed in the substrate, one of the regions being coupled to the digit line.

19. The memory device of claim 17 wherein the bank further comprises:

the first memory cell including first and second source/drain regions disposed in the substrate; and an electrically conductive strap disposed on the first source/drain region of the first memory cell and on a region of the digit line.

20. The memory device of claim 17 wherein the first and second memory cells comprise dram-type memory cells.

21. A computer system, comprising:

a data input device;

a data output device; and computing circuitry coupled to the data input and output devices, the computing circuitry including a memory device that includes, address, data, and command busses, a bank of memory cells arranged in rows and columns, the bank comprising, a semiconductor substrate, an isolation trench disposed in the substrate and having first and second opposite sides, a digit line disposed in the trench, a first memory cell disposed in the substrate adjacent to the first side of the trench, the first memory cell being coupled to the digit line, and a second memory cell disposed in the substrate adjacent to the second side of the trench;

an address decoder coupled to the address bus and to the bank, a read/write circuit coupled to the address decoder and to the digit line, a data input/output circuit coupled to the data bus and to the read/write circuit, and a control circuit coupled to the command bus, to the address decoder, to the read/write circuit, and to the data input/output circuit.

22. The computer system of claim 21 wherein the first memory cell comprises a pair of source/drain regions disposed in the substrate, one of the regions being coupled to the digit line.

23. The computer system of claim 21 wherein the bank further comprises:

the first memory cell including first and second source/drain regions disposed in the substrate; and an electrically conductive strap disposed on the first source/drain region of the first memory cell and on the digit line.

24. A memory array, comprising:

a semiconductor substrate;

isolation trenches disposed in the substrate;

digit lines each disposed within a respective one of the trenches;

isolation segments disposed in the substrate between adjacent ones of the trenches; and pairs of adjacent memory cells, each pair bordered by a respective pair of isolation segments and a respective pair of isolation trenches, each pair including a shared source/drain region that is disposed in the substrate and coupled to one of the digit lines.

25. The memory array of claim 24, further comprising a dielectric material disposed in the isolation trenches and encapsulating the digit lines, the dielectric material having respective openings where the shared source/drain regions are coupled to the digit lines.

26. The memory array of claim 24 wherein:

the trenches are substantially parallel to one another; and the isolation segments are substantially parallel to one another and are substantially orthogonal to the trenches.

27. The memory array of claim 24, further comprising:

the memory cells each including, a gate insulator disposed on the substrate and adjacent to the shared source/drain region, and a gate disposed on the gate insulator; and word lines that are coupled to the gates of the memory cells according to a folded-digit-line layout.

28. A memory circuit, comprising:

a semiconductor substrate;

substantially parallel isolation trenches that are disposed in the substrate;

digit lines that are respectively disposed within the trenches;

trench insulators that are disposed within the trenches and on the digit lines, the trench insulators having openings that expose portions of the digit lines;

substantially parallel isolation segments that are disposed in the substrate substantially orthogonally to the trenches such that first segments that are adjacent to a first side of a trench are offset approximately half way between second segments that are adjacent to a second side of the trench;

active areas that are defined in the substrate and bounded by the trenches and segments;

pairs of memory cells that are each disposed in a respective one of the active areas, each pair of cells including a common source/drain region that is disposed in the substrate and that is coupled to a respective exposed portion of one of the digit lines, each cell of the pair including a gate insulator that is disposed on the substrate and that is substantially contiguous with the common region, each cell of the pair including a gate disposed on the gate insulator.

29. The memory circuit of claim 28, further comprising word lines that are each respectively coupled to memory cells that are adjacent to the first side of a respective trench and to memory cells that are adjacent to the second side of the trench.

30. The memory circuit of claim 28, further comprising;

first word lines that are each respectively coupled only to memory cells that are adjacent to the first side of a respective trench; and second word lines that are each respectively coupled only to memory cells that are adjacent to the second side of the trench.

31. The memory circuit of claim 28, further comprising word lines that are each coupled to a respective row of the memory cells, the word lines each having a sub-lithographic dimension.

32. A memory array, comprising:

a semiconductor substrate;

isolation trenches disposed in the substrate;

conductors each disposed within a respective one of the trenches;

isolation segments disposed in the substrate between adjacent ones of the trenches; and pairs of adjacent memory cells disposed in the substrate, each pair bordered by a respective pair of isolation segments and a respective pair of isolation trenches, the memory cells each being coupled to one of the conductors.

33. The memory array of claim 32, further comprising a dielectric material disposed in the isolation trenches and encapsulating the conductors, the dielectric material having respective openings where the memory cells are coupled to the conductors.

34. The memory array of claim 32 wherein:

the trenches are substantially parallel to one another; and the isolation segments are substantially parallel to one another and are substantially orthogonal to the trenches.

35. The memory array of claim 32, further comprising:

the memory cells each including,
    a gate insulator disposed on the substrate, and
    a gate disposed on the gate insulator; and word lines that are coupled to the gates of the memory cells according to a folded-digit-line layout.

36. A memory circuit, comprising:

a semiconductor substrate;

substantially parallel isolation trenches that are disposed in the substrate;

conductors that are respectively disposed within the trenches;

trench insulators that are disposed within the trenches and on the conductors, the trench insulators having openings that expose portions of the conductors;

substantially parallel isolation segments that are disposed in the substrate substantially orthogonally to the trenches such that first segments that are adjacent to a first side of a trench are offset approximately half way between second segments that are adjacent to a second side of the trench;

active areas that are defined in the substrate and bounded by the trenches and segments; and pairs of memory cells that are each disposed in a respective one of the active areas, the memory cells each being coupled to one of the conductors, the memory cells each including a gate insulator that is disposed on the substrate and a gate disposed on the gate insulator.

37. The memory circuit of claim 36, further comprising word lines that are each respectively coupled to memory cells that are adjacent to the first side of a respective trench and to memory cells that are adjacent to the second side of the trench.

38. The memory circuit of claim 36, further comprising;

first word lines that are each respectively coupled only to memory cells that are adjacent to the first side of a respective trench; and second word lines that are each respectively coupled only to memory cells that are adjacent to the second side of the trench.

39. The memory circuit of claim 36, further comprising word lines that are each coupled to a respective row of the memory cells, the word lines each having a sub-lithographic dimension.

\* \* \* \* \*

UNITED STATES PATENT AND TRADEMARK OFFICE
CERTIFICATE OF CORRECTION

PATENT NO. : 5,892,707
DATED : April 6, 1999
INVENTOR(S) : Wendell Noble

It is certified that error appears in the above-identified patent and that said Letters Patent is hereby corrected as shown below:

Reads              Should Read

Column 12, line 37    ".adjacent"    -- adjacent --

Signed and Sealed this

First Day of May, 2001

Attest:

NICHOLAS P. GODICI

Attesting Officer    Acting Director of the United States Patent and Trademark Office